US009087475B2

(12) United States Patent
Lu

(10) Patent No.: US 9,087,475 B2
(45) Date of Patent: Jul. 21, 2015

(54) CELL TEST METHOD AND LIQUID CRYSTAL DISPLAY PANEL FOR A TRI-GATE TYPE PIXEL STRUCTURE

(75) Inventor: Tai-Fu Lu, Tainan (TW)

(73) Assignee: HANNSTAR DISPLAY CORPORATION, New Taipei (TW)

( * ) Notice: Subject to any disclaimer, the term of this patent is extended or adjusted under 35 U.S.C. 154(b) by 325 days.

(21) Appl. No.: 13/612,430

(22) Filed: Sep. 12, 2012

(65) Prior Publication Data

US 2013/0088679 A1 Apr. 11, 2013

(30) Foreign Application Priority Data

Oct. 5, 2011 (TW) ............................ 100136088 A

(51) Int. Cl.
*G01R 31/26* (2014.01)
*G09G 3/00* (2006.01)

(52) U.S. Cl.
CPC ...................................... *G09G 3/006* (2013.01)

(58) Field of Classification Search
CPC .................... G09G 3/006; G02F 2001/136254
USPC .......................... 324/760.01, 760.02, 761.01; 349/149–152, 192, 40; 345/87, 204; 257/59–61; 365/163
See application file for complete search history.

(56) References Cited

U.S. PATENT DOCUMENTS

2005/0146349 A1* 7/2005 Lai et al. ........................ 324/770
2006/0261842 A1* 11/2006 Lee et al. ....................... 324/770
2007/0046316 A1* 3/2007 Uei et al. ....................... 324/770
2008/0123012 A1* 5/2008 Ohtomo ........................... 349/54
2010/0002021 A1* 1/2010 Hashimoto et al. ........... 345/690
2010/0127258 A1* 5/2010 Kang et al. ....................... 257/48
2010/0171507 A1* 7/2010 Hung ............................ 324/537
2010/0237896 A1* 9/2010 Ohgiichi et al. .............. 324/770
2011/0018571 A1* 1/2011 Kim et al. ................ 324/760.02

* cited by examiner

*Primary Examiner* — Patrick Assouad
*Assistant Examiner* — Demetrius Pretlow
(74) *Attorney, Agent, or Firm* — Muncy, Geissler, Olds & Lowe, P.C.

(57) ABSTRACT

A cell test method for a liquid crystal display panel includes the following steps. A waveform sequence to shorting bars is provided, wherein the waveform sequence includes that the first gate line sends a voltage of "turn on" signal and the second and third gate lines send a voltage of "turn off" signal at the first and second time periods; and the waveform sequence further comprises that the first and second data lines respectively send first and second voltages at the first and second time periods, the first threshold voltage is higher than the first voltage, the first voltage is higher than the common voltage, the common voltage is higher than the second voltage, and the second voltage is higher than the second threshold voltage, whereby pixels defined by the first gate line and the first and second data lines is turn on.

12 Claims, 21 Drawing Sheets

CELL TEST METHOD AND LIQUID CRYSTAL DISPLAY PANEL FOR A TRI-GATE TYPE PIXEL STRUCTURE

CROSS-REFERENCE TO RELATED APPLICATION

This application claims the benefit of Taiwan Patent Application No. 100136088, filed on Oct. 5, 2011, which is hereby incorporated by reference for all purposes as if fully set forth herein.

BACKGROUND OF THE DISCLOSURE

1. Field of Disclosure

The present disclosure relates to a cell test method for a tri-gate type pixel structure, and more particularly to a liquid crystal display panel using shorting bars for test.

2. Related Art

A manufacture of a liquid crystal display panel includes an array process, a cell process and a module process, wherein a product can be tested after each process, whereby the deflective product can be rejected.

Referring FIG. 1, it shows a schematic plan view of a liquid crystal display panel 10 in the prior art. Test pads 60 for a cell test method are disposed a non-display region of the liquid crystal display panel 10. When shorting bars are used for the cell test method, signals of odd gate lines $G_{odd}$ and even gate lines $G_{even}$ (i.e., scan lines) are separated from each other, and signals of red data lines $D_R$, green data lines $D_G$ and blue data lines $D_B$ are also separated from each other. The first shorting bar 61 is electrically connected to the red data lines $D_R$, the second shorting bar 62 is electrically connected to the green data lines $D_G$, the third shorting bar 63 is electrically connected to the blue data lines $D_B$, the fourth shorting bar 64 is electrically connected to the odd gate lines $G_{odd}$, and the fifth shorting bar 65 is electrically connected to the gate lines $G_{odd}$ and $G_{even}$, data lines $D_R$, $D_G$ and $D_B$.

Recently, the test pads 60 for a cell test method using the shorting bars are corresponding to the gate lines $G_{odd}$ and $G_{even}$, the data lines $D_R$, $D_G$ and $D_B$ and common voltage $V_{com}$ respectively. When the common voltage $V_{com}$ is 5V (volt), a waveform sequence of the shorting bars is shown in FIG. 3 if red pixels (R pixels) need to be turn on (shown in FIG. 2). For example, when the gate lines $G_{odd}$ and $G_{even}$ send a voltage of "turn-on" signal (e.g., 17V is the voltage of "turn-on" signal, and −8V is the voltage of "turn-off" signal.), the R pixels can be turn on if the data lines $D_R$ sends voltages of 5.1V and 4.9V; and G and B pixels can be turn off if the data lines $D_G$ and $D_B$ sends voltages of 10V and 0V.

Similarly, when the common voltage $V_{com}$ is 5V, a waveform sequence of the shorting bars is shown in FIG. 5 if G pixels need to be turn on (shown in FIG. 4). For example, when the gate lines $G_{odd}$ and $G_{even}$ send a voltage of "turn-on" signal (e.g., 17V is the voltage of "turn-on" signal, and −8V is the voltage of "turn-off" signal), the G pixels can be turn on if the data lines $D_G$ sends voltages of 5.1V and 4.9V; and R and B pixels can be turn off if the data lines $D_R$ and $D_B$ sends voltages of 10V and 0V.

Similarly, when the common voltage $V_{com}$ is 5V, a waveform sequence of the shorting bars is shown in FIG. 7 if B pixels need to be turn on (shown in FIG. 6). For example, when the gate lines $G_{odd}$ and $G_{even}$ send a voltage of "turn-on" signal (e.g., 17V is the voltage of "turn-on" signal, and −8V is the voltage of "turn-off" signal), the B pixels can be turn on if the data lines $D_B$ sends voltages of 5.1V and 4.9V; and R and G pixels can be turn off if the data lines $D_R$ and $D_G$ sends voltages of 10V and 0V.

The above-mentioned cell test method and the waveform sequence of the shorting bars thereof are mainly applied to a thin film transistor liquid crystal display panel having a single-gate type pixel structure. However, the above-mentioned cell test method and the waveform sequence of the shorting bars thereof cannot be applied to a thin film transistor liquid crystal display panel having a tri-gate type pixel structure, because the single-gate type pixel structure uses the data lines $D_R$, $D_G$ and $D_B$. to control R, G and B pixels, but the tri-gate type pixel structure changes this design and uses the gate lines $G_R$, $G_G$ and $G_B$. to drive R, G and B. pixels. If the cell test method for the tri-gate type pixel structure also uses the shorting bars for test, the waveform sequence of the shorting bars of the single-gate type pixel structure can not drive R, G and B pixels to be turn on in order. For example, when the gate lines $G_R$ and $G_G$ send a voltage of "turn-on" signal at the same time period, the R and G pixels can be turn on at the same time period (shown in FIG. 8) if the data lines $D_{even}$ sends voltages of 5.1V and 4.9V.

Therefore, it is required to provide a cell test method for the tri-gate type pixel structure capable of solving the forgoing problems.

SUMMARY OF THE DISCLOSURE

The present disclosure is directed to a cell test method for a liquid crystal display panel, the liquid crystal display panel including a plurality of first, second and third gate lines, a plurality of first and second data lines, a first gate line shorting bar, a second gate line shorting bar, a third gate line shorting bar, a first data line shorting bar and a second data line shorting bar, the first, second and third gate lines periodically disposed in order and electrically connected or electrically coupled to the first, second and third gate line shorting bars respectively, the first and second data lines periodically disposed in order and electrically connected or electrically coupled to the first and second data line shorting bars respectively, and the liquid crystal display panel having a common voltage, a first threshold voltage and a second threshold voltage.

The cell test method comprises the following steps of: providing a first waveform sequence to the first, second and third gate line shorting bars and the first and second data line shorting bars, wherein the first waveform sequence comprises the following steps of: sending a voltage of "turn-on" signal to the first gate lines, and sending a voltage of "turn-off" signal to the second and third gate lines at first time period and second time period; and sending a first voltage and a second voltage to the first and second data lines at the first and second time periods respectively, wherein the first threshold voltage is higher than the first voltage, the first voltage is higher than the common voltage, the common voltage is higher than the second voltage, and the second voltage is higher than the second threshold voltage, whereby the pixels defined by all of the first gate lines and the first and second data lines can be turn on.

The cell test method further comprises the following steps of: providing a second waveform sequence to the first, second and third gate line shorting bars and the first and second data line shorting bars, wherein the second waveform sequence comprises the following steps of: sending a voltage of "turn-on" signal to the second gate lines, and sending a voltage of "turn-off" signal to the first and third gate lines at the first time period and the second time period; and sending the first voltage and the second voltage to the first and second data lines at the first and second time periods respectively, wherein the first threshold voltage is higher than the first voltage, the first voltage is higher than the common voltage, the common voltage is higher than the second voltage, and the second voltage is higher than the second threshold voltage, whereby the pixels defined by all of the second gate lines and the first and second data lines can be turn on.

The cell test method further comprises the following steps of: providing a third waveform sequence to the first, second and third gate line shorting bars and the first and second data line shorting bars, wherein the third waveform sequence comprises the following steps of sending a voltage of "turn-on" signal to the third gate lines, and sending a voltage of "turn-off" signal to the first and second gate lines at the first time period and the second time period; and sending the first voltage and the second voltage to the first and second data lines at the first and second time periods respectively, wherein the first threshold voltage is higher than the first voltage, the first voltage is higher than the common voltage, the common voltage is higher than the second voltage, and the second voltage is higher than the second threshold voltage, whereby the pixels defined by all of the third gate lines and the first and second data lines can be turn on.

All gate lines are grouped into three sets of $G_R$, $G_G$ and $G_B$ in accordance with a color to be displayed by the gate lines, and three sets of $G_R$, $G_G$ and $G_B$ are physically connected to three gate line shorting bars respectively. All data lines are grouped into two sets of $D_{odd}$ and $D_{even}$ in accordance with odd and even, and two sets of $D_{odd}$ and $D_{even}$ are physically connected to two data line shorting bars respectively. During the cell test method, different signals are inputted to the three gate line shorting bars, and simultaneously same signals are inputted to the two data line shorting bars, thereby effectively inspecting defects of the R, G and B pixels.

In order to make the aforementioned and other objectives, features and advantages of the present disclosure comprehensible, embodiments are described in detail below with reference to the accompanying drawings.

BRIEF DESCRIPTION OF THE DRAWINGS

The present disclosure will become more fully understood from the detailed description given herein below for illustration only, and thus are not limitative of the present disclosure, and wherein:

FIG. 2 is a schematic view showing that red pixels (R pixels) of a liquid crystal display panel in the prior art are turn on;

FIG. 3 is a schematic view showing a waveform sequence of shorting bars of a liquid crystal display panel in the prior art, wherein the red pixels are turn on;

FIG. 4 is a schematic view showing that green pixels (G pixels) of a liquid crystal display panel in the prior art are turn on;

FIG. 5 is a schematic view showing a waveform sequence of shorting bars of a liquid crystal display panel in the prior art, wherein the green pixels are turn on;

FIG. 6 is a schematic view showing that blue pixels (B pixels) of a liquid crystal display panel in the prior art are turn on;

FIG. 7 is a schematic view showing a waveform sequence of shorting bars of a liquid crystal display panel in the prior art, wherein the blue pixels are turn on;

FIG. 8 is a schematic view showing that red pixels (R pixels) and green pixels (G pixels) of a liquid crystal display panel having a tri-gate type pixel structure in the prior art are turn on;

FIG. 12 is a schematic view showing a waveform sequence of shorting bars of a liquid crystal display panel according to the embodiment of the present disclosure, wherein the red pixels are turn on;

FIG. 14 is a schematic view showing a waveform sequence of shorting bars of a liquid crystal display panel according to the embodiment of the present disclosure, wherein the green pixels are turn on;

FIG. 16 is a schematic view showing a waveform sequence of shorting bars of a liquid crystal display panel according to the embodiment of the present disclosure, wherein the blue pixels are turn on;

FIG. 17 is a schematic view showing a waveform sequence of shorting bars of a liquid crystal display panel according to another embodiment of the present disclosure, wherein the red pixels are turn on;

FIG. 19 is a schematic view showing a waveform sequence of shorting bars of a liquid crystal display panel according to another embodiment of the present disclosure, wherein the green pixels are turn on;

FIG. 20 is a schematic view showing a waveform sequence of shorting bars of a liquid crystal display panel according to another embodiment of the present disclosure, wherein the blue pixels are turn on.

DETAILED DESCRIPTION OF THE DISCLOSURE

Figure 1:
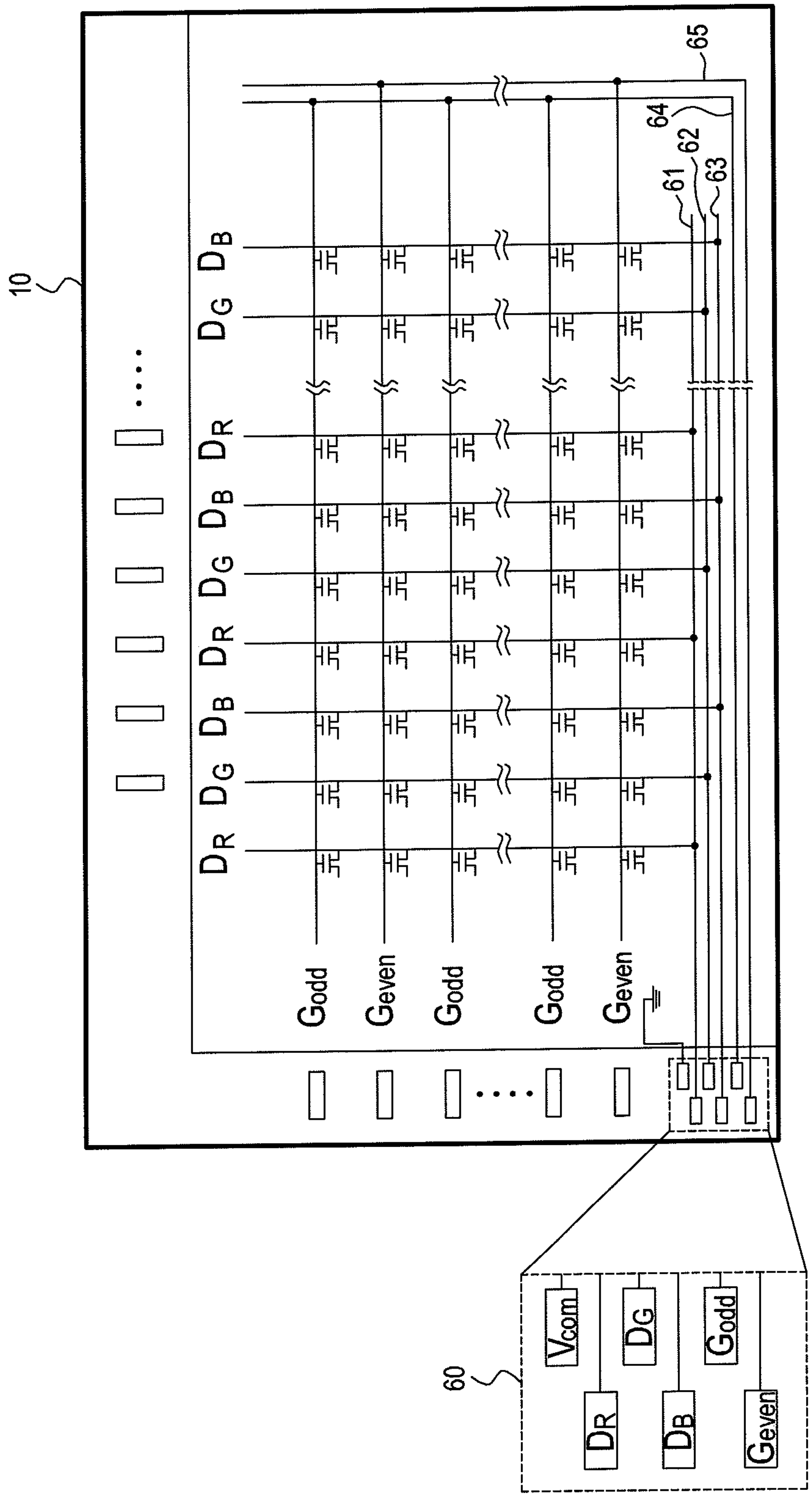
FIG. 1 (PRIOR ART)
FIG. 1 is a schematic plan view of a liquid crystal display panel having a single-gate type pixel structure in the prior art.
Figure 2:
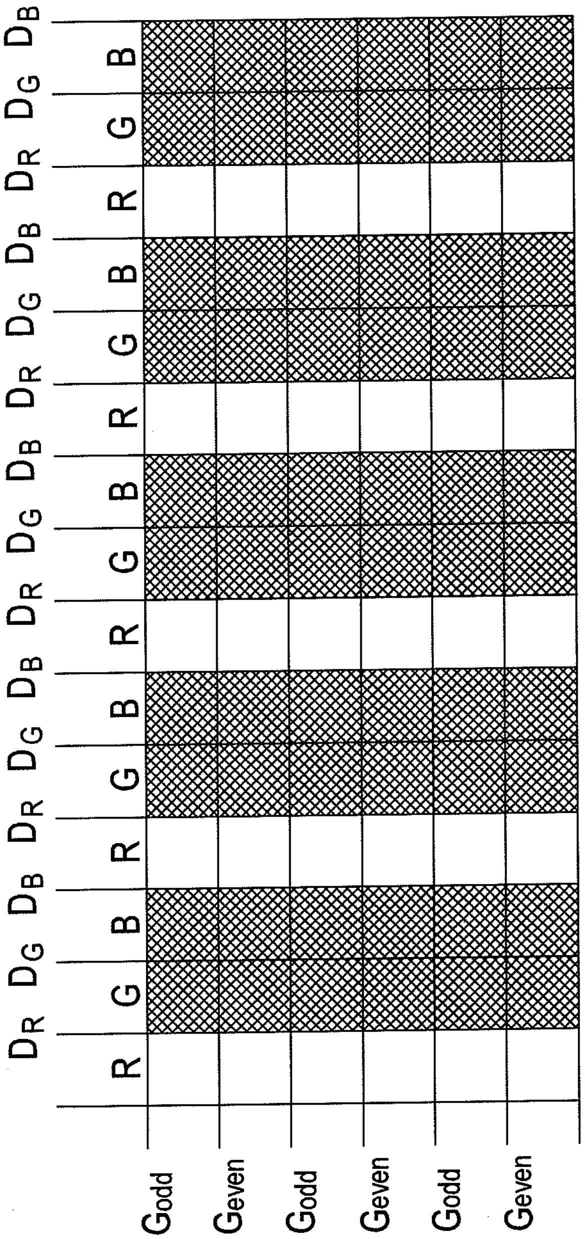
FIG. 2 (PRIOR ART)
Figure 3:
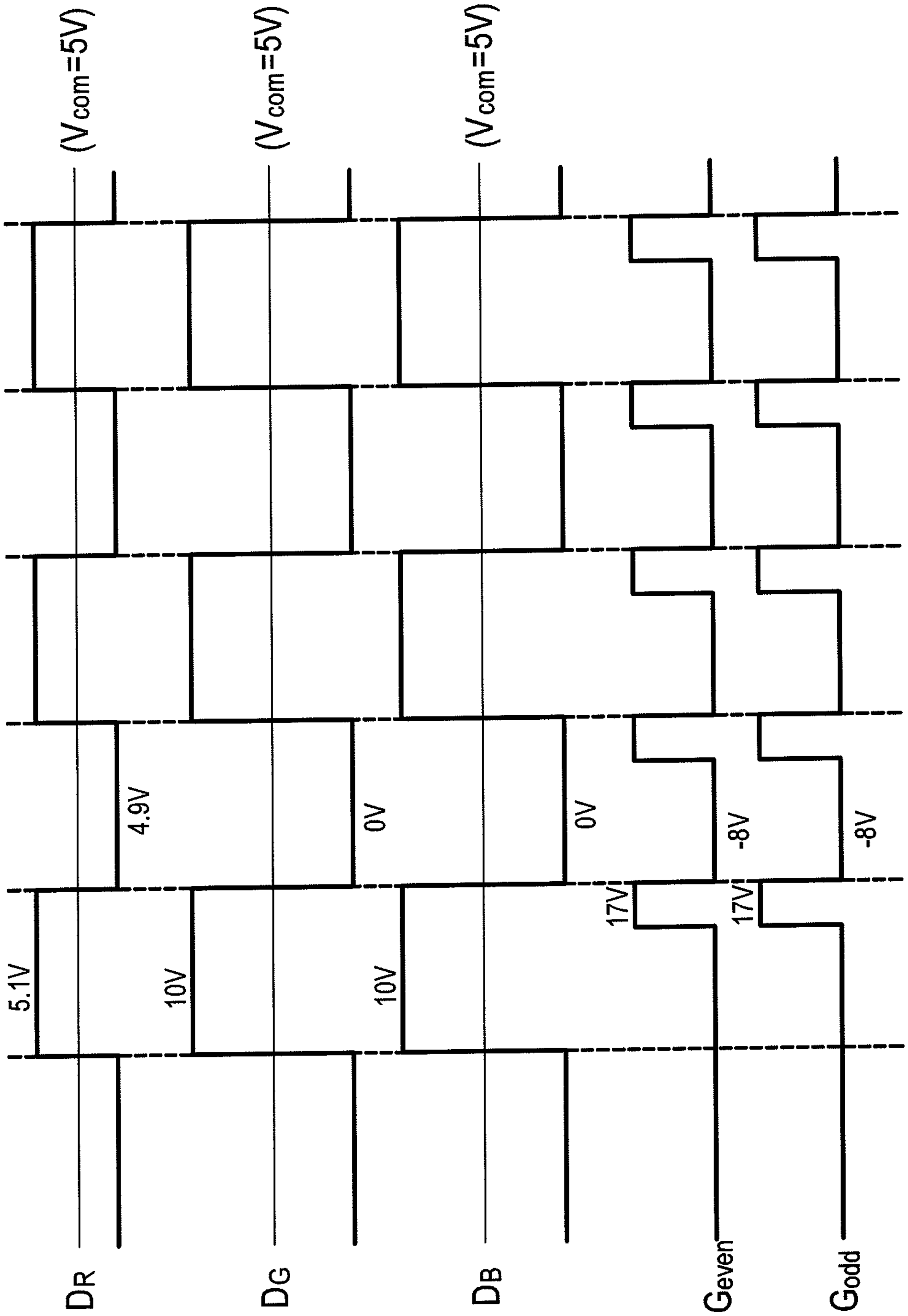
FIG. 3 (PRIOR ART)
Figure 4:
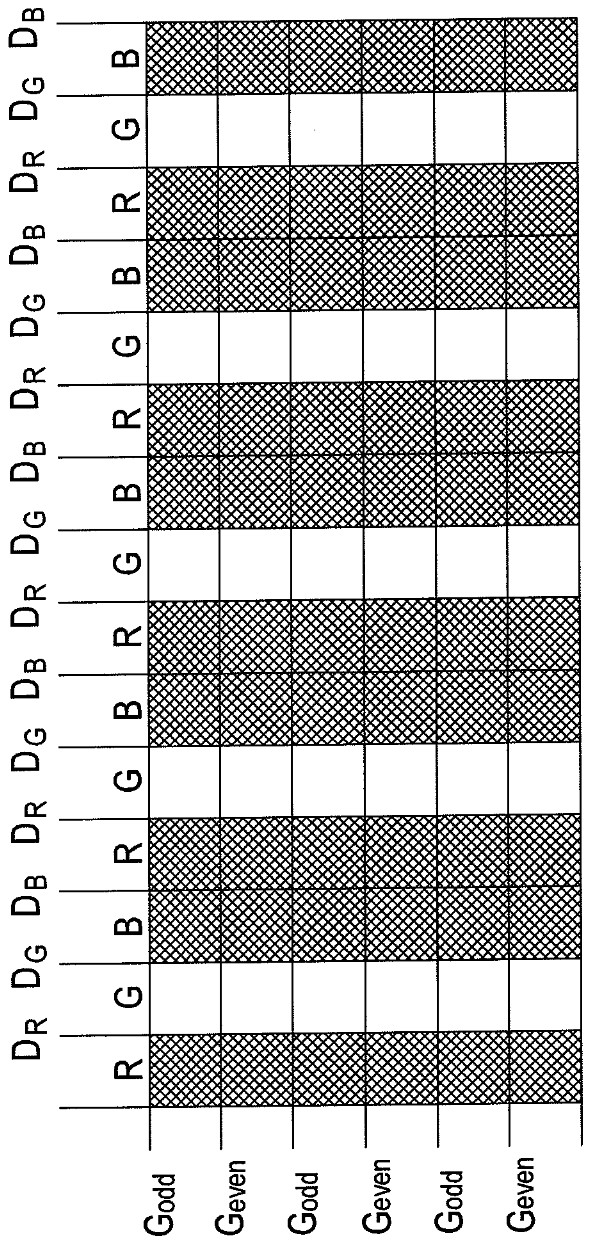
FIG. 4 (PRIOR ART)
Figure 5:
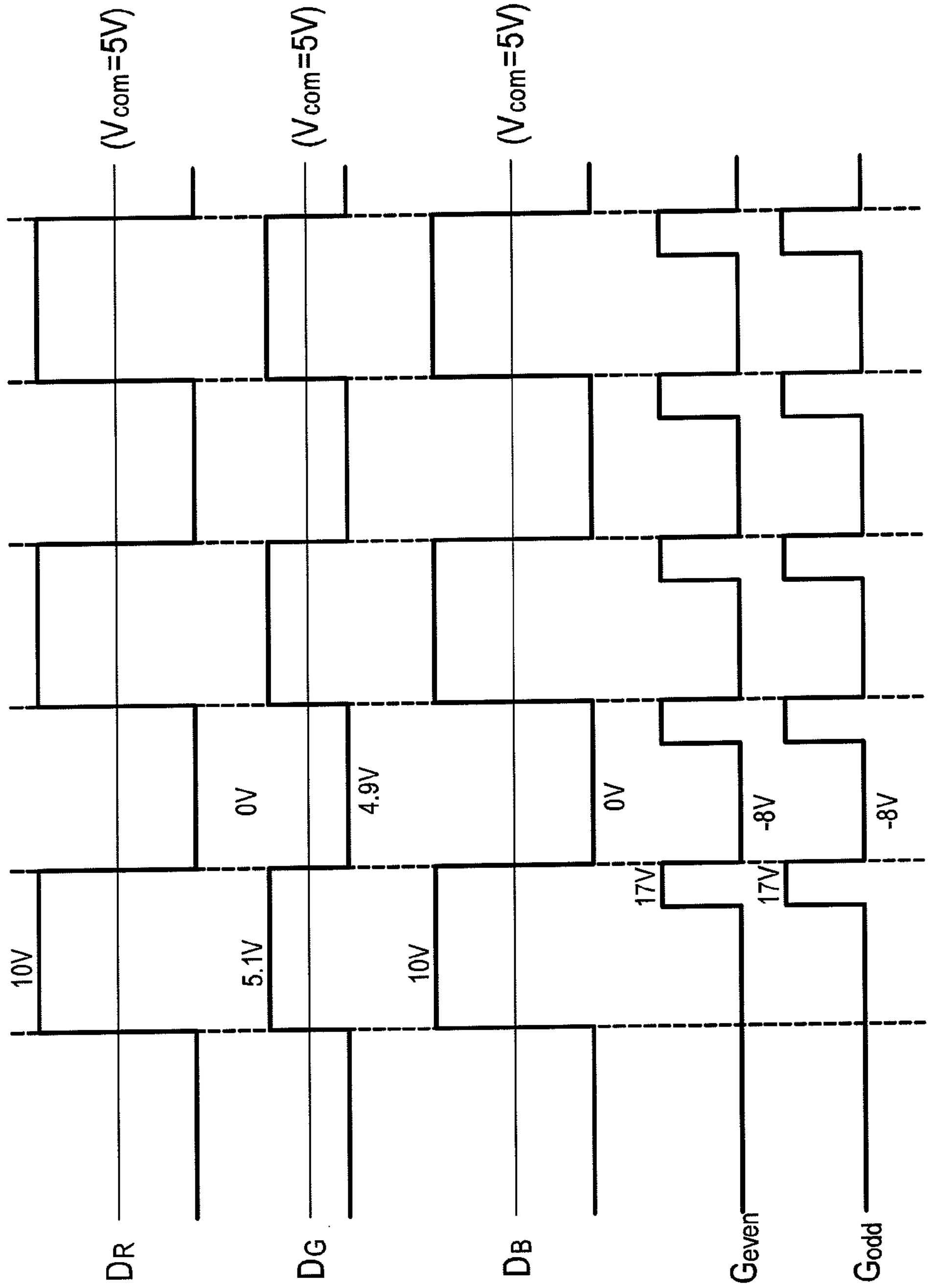
FIG. 5 (PRIOR ART)
Figure 6:
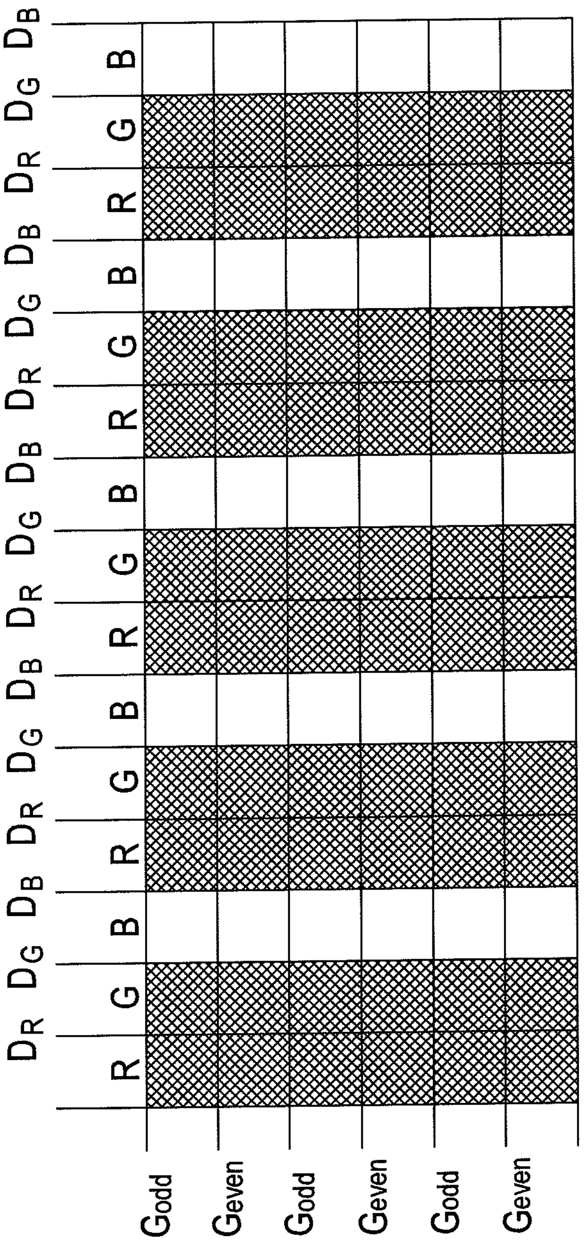
FIG. 6 (PRIOR ART)
Figure 7:
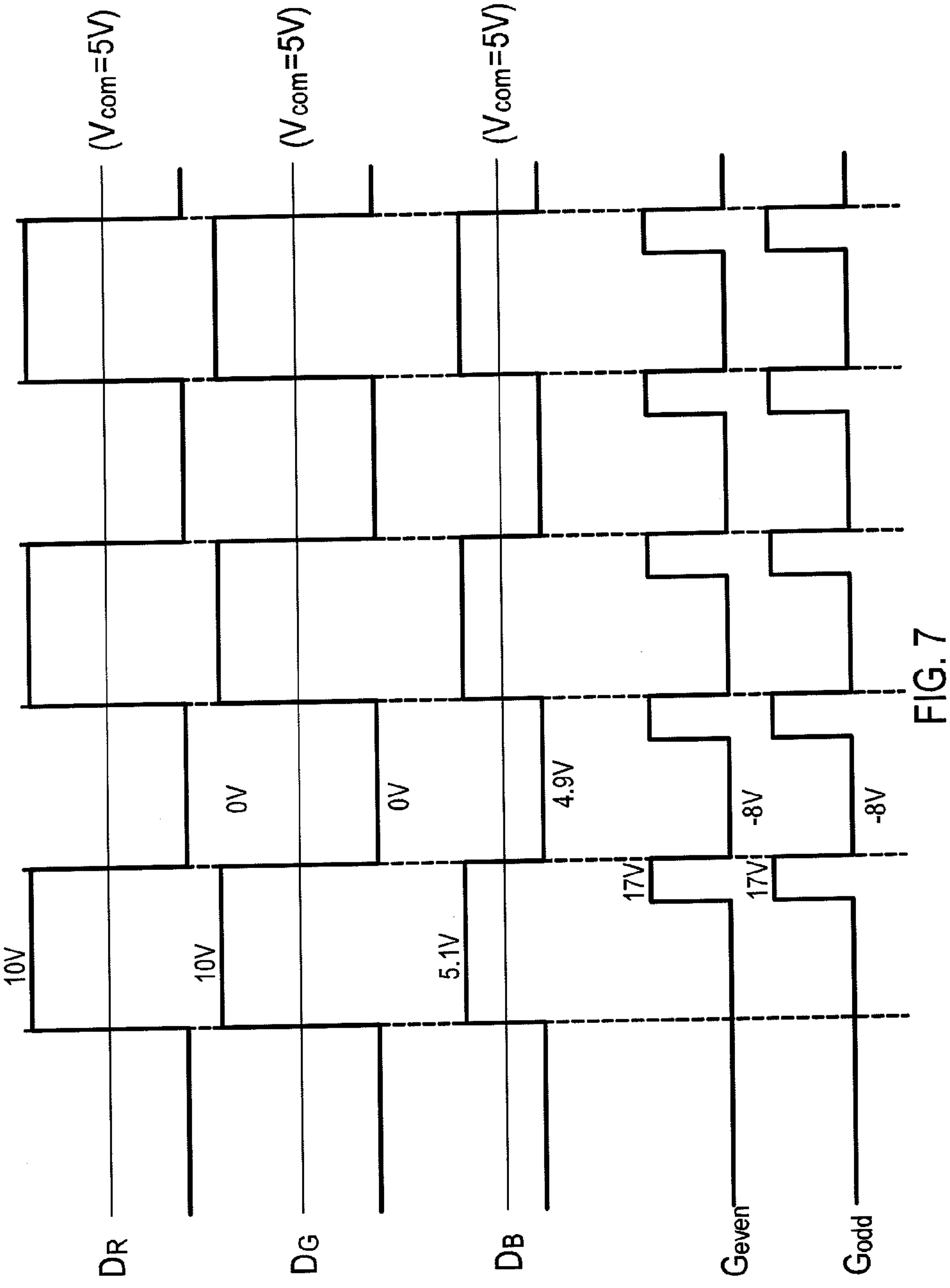
FIG. 7 (PRIOR ART)
Figure 8:
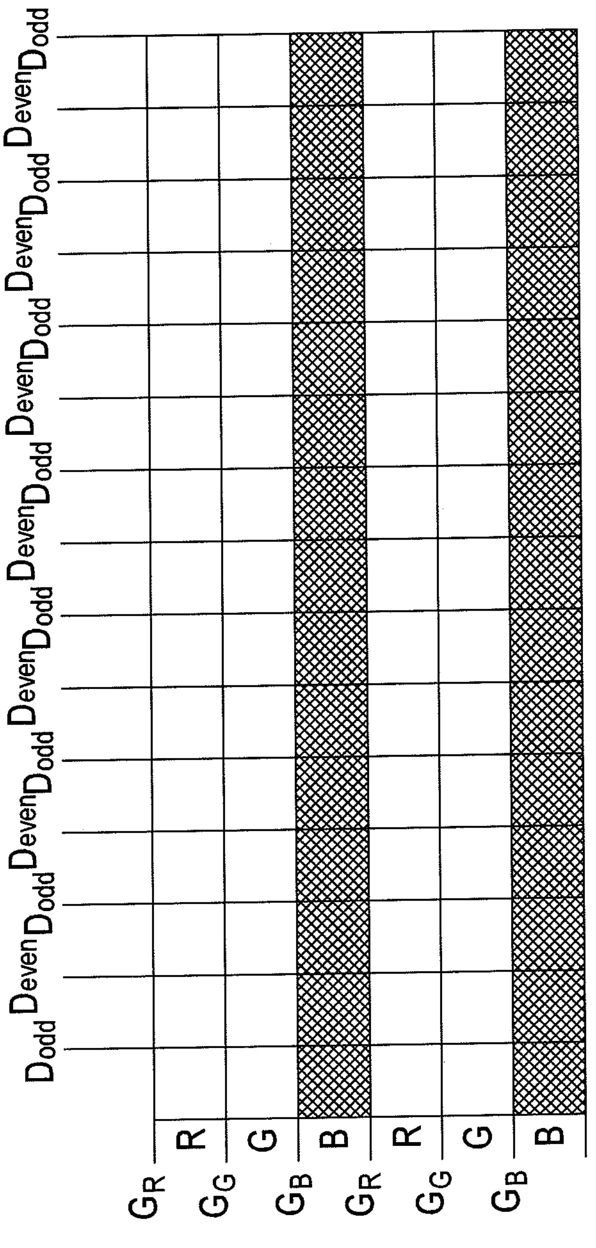
FIG. 8 (PRIOR ART)
Figure 9:
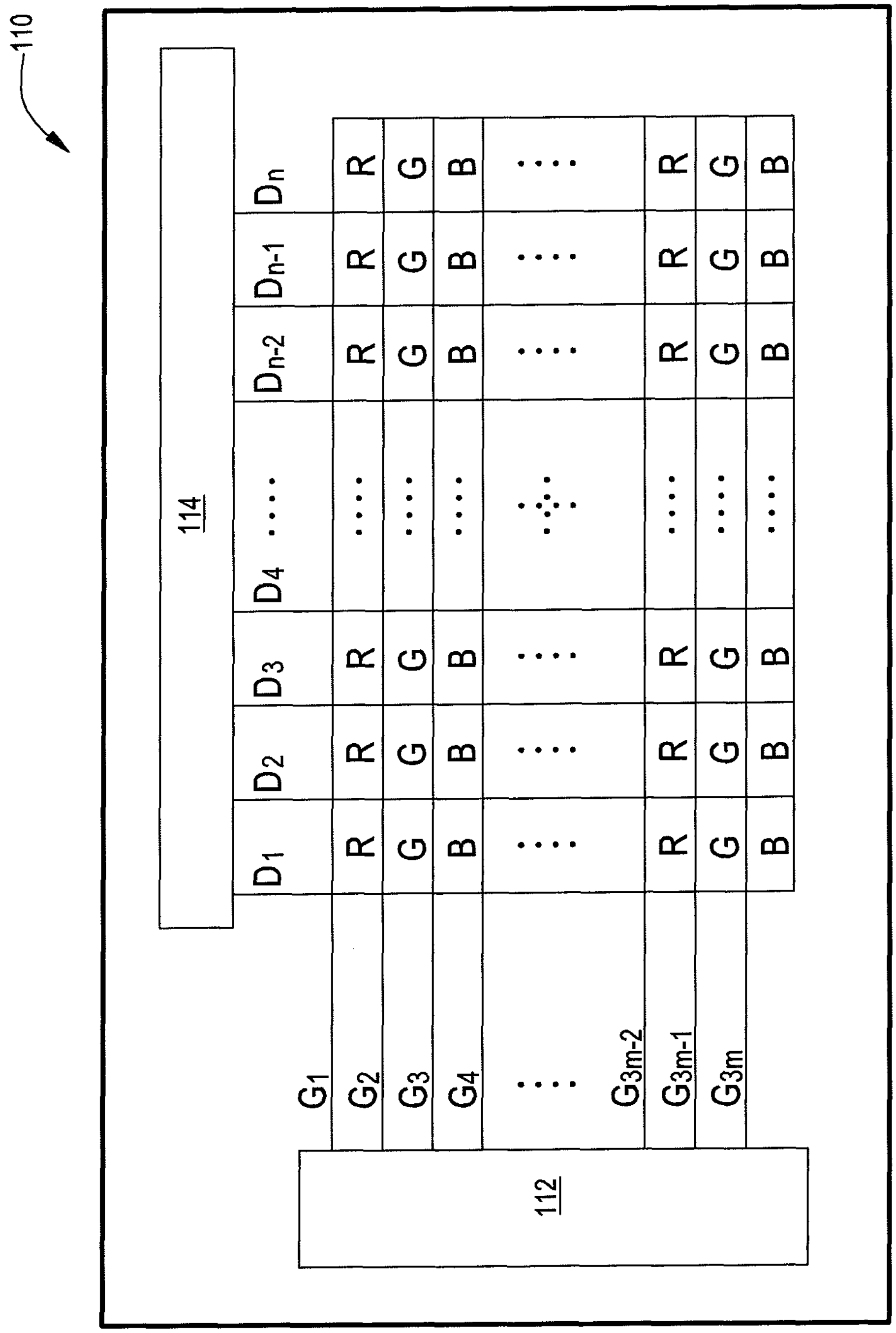
FIG. 9 is a schematic plan view of a liquid crystal display panel having a tri-gate type pixel structure according to an embodiment of the present disclosure.

Referring to FIG. 9, it show a schematic plan view of a liquid crystal display panel 110 having a tri-gate type pixel structure according to an embodiment of the present disclosure. For example, the resolution is n*m, and the liquid crystal display panel 110 having the tri-gate type pixel structure includes m*3 gate lines (i.e., scan lines) G1~G3$m$ and $n$ data lines D1~Dn. As shown in FIG. 9, the gate lines G1~G3*m* and the data lines D1~Dn define 3*m*n sub-pixels. The sub-pixels are red sub-pixels (R sub-pixels), green sub-pixels (G sub-pixels) and blue sub-pixels (B sub-pixels). The gate lines G1~G3*m* are electrically connected to a module 112 having gate driving chips, and the data lines D1~Dn are electrically connected to a module 114 having source driving chips. According to the resolution being n*m, the numbers of the gate lines and data lines of the liquid crystal display panel 110 having the tri-gate type pixel structure are 3m and n respectively. But, the numbers of the gate lines and data lines of the conventional liquid crystal display panel having the single-gate type pixel structure are m and 3n respectively. In other words, compared with the conventional liquid crystal display panel having the single-gate type pixel structure at the same resolution, the numbers of the gate lines of the liquid crystal display panel 110 is increased to be 3 times, and the numbers of the data lines of the liquid crystal display panel 110 is decreased to be one third. Consequently, the liquid crystal display panel 110 uses more gate driving chips and less source driving chips. Generally, the cost and power consumption of the gate driving chips are less than those of data driving chips, and thus the liquid crystal display panel 110 using the tri-gate type pixel structure has less cost and power consumption.

The liquid crystal display panel 110 includes a plurality of pixel units arranged in an array manner, and includes gate lines G1~G3*m*, data lines D1~Dn, thin film transistors, liquid crystal capacitances and storage capacitances. The thin film transistors are adapted to be switch elements of the pixel units, the gate lines and data lines are adapted to provide proper operated voltage to the selected pixel unit, thereby driving each pixel unit so as to show an image. In addition, the liquid crystal capacitance is constituted by a pixel electrode, a common electrode and a liquid crystal layer located therebetween. When there is a voltage applied to the pixel electrode and the common electrode, liquid crystal molecules of the liquid crystal layer are rearranged in accordance with the direction and magnitude of an electric filed, whereby light passing through the liquid crystal display panel has different brightness and gray level value. A threshold voltage is defined to be an applied voltage which causes the liquid crystal molecules to be rotated. In addition, after the voltage applied at the pixel electrode is turn off, the storage capacitance is applied to provide a necessary voltage which keep the liquid crystal molecules in an inclined direction.

During the driving process of the liquid crystal display panel, the property of the liquid crystal molecules can be destroyed after the liquid crystal molecules are kept in a constant electric field in a long period, and thus the liquid crystal molecules cannot be operated in accordance with the change of the electric field. Accordingly, the magnitude of the electric field at the liquid crystal molecules must be changed in each time period. However, if some pixel unit needs to show the same gray level value in a long period, the direction of the electric field can be changed in an alternative manner of positive polarity and negative polarity, thereby preventing the liquid crystal molecules from destroying. But, the magnitude of the electric field doesn't need to be changed. In the first time period T1, the voltage signal of the pixel electrode is positive polarity, and the voltage difference between the pixel electrode and the common electrode is ΔV1. In the second time period T2, the voltage signal of the pixel electrode is negative polarity, and the voltage difference between the pixel electrode and the common electrode is ΔV2. If the gray level value shown in the first time period T1 is equal to that shown in the second time period T2, the absolute value of the voltage difference ΔV1 must be equal to that of the voltage difference ΔV2.

Figure 10:
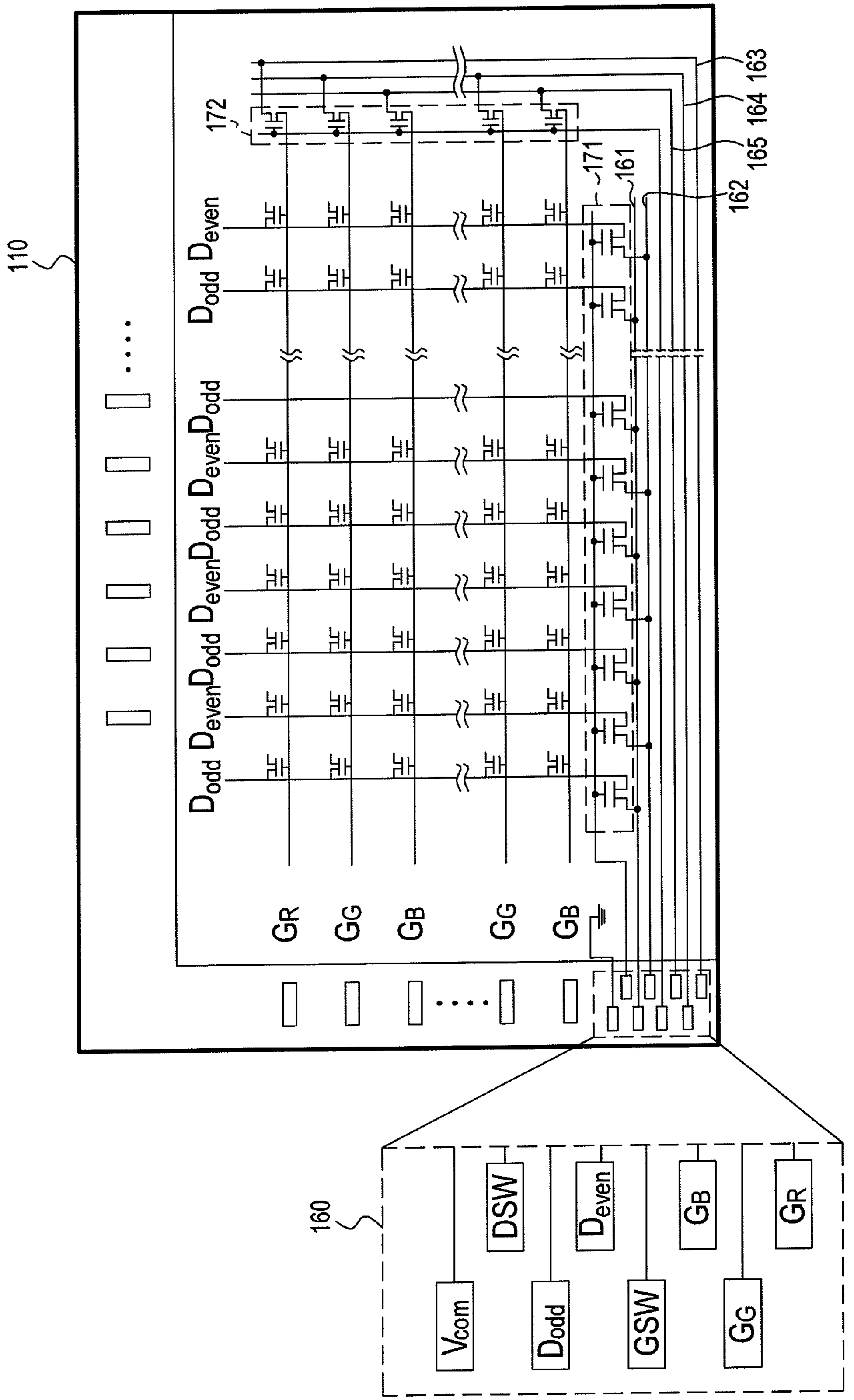
FIG. 10 is a schematic plan view of a liquid crystal display panel having a tri-gate type pixel structure according to the embodiment of the present disclosure, showing that test pads are electrically connected to gate lines and data lines through shorting bars.

Referring to FIG. 10, the gate lines G1~G3*m* can include red gate lines $G_R$, green gate lines $G_G$ and blue gate lines $G_B$ which all are transversely extended and longitudinally disposed periodically in order. Also, the data lines D1~Dn can include data lines $D_{odd}$ and data lines $D_{even}$ which all are longitudinally extended and transversely disposed periodically in order. Test pads 160 (e.g., the test pads 160 are corresponding to the gate lines $G_R$, $G_G$ and $G_B$, the data lines $D_{odd}$ and $D_{even}$, data line switches DSW, gate line switches GSW and common voltage $V_{com}$ respectively) for a cell test method are disposed a non-display region of the liquid crystal display panel 110. When shorting bars are used for the cell test method, signals of the red gate lines $G_R$, green gate lines $G_G$ and blue gate lines $G_B$ are separated from each other, and signals of the data lines $D_{odd}$ and $D_{even}$ are also separated from each other. Data line shorting bar 161 is electrically connected to the data lines $D_{odd}$ and the test pad 160 of the data lines $D_{odd}$, data line shorting bar 162 is electrically connected to the data lines $D_{even}$ and the test pad 160 of the data lines $D_{even}$, gate line shorting bar 163 is electrically connected to the red gate lines $G_R$ and the test pad 160 of the red gate lines $G_R$, gate line shorting bar 164 is electrically connected to the green gate lines $G_G$ and the test pad 160 of the green gate lines $G_G$, and gate line shorting bar 165 is electrically connected to the blue gate lines $G_B$ and the test pad 160 of the blue gate lines $G_B$. When the liquid crystal display panel 110 is executed by the cell test method, test signals are inputted to the test pads, and transmitted from the above-mentioned shorting bars to the above-mentioned gate lines and data lines.

During the cell test method, there is a switch circuit which can be provided to selectively electrically coupled the above-mentioned shorting bars to the above-mentioned gate lines and data lines or electrically isolating the above-mentioned shorting bars from the above-mentioned gate lines and data lines. In this embodiment, the switch circuit includes a first switch 171 (i.e., data line switch DSW) and a second switch 172 (i.e., gate line switch GSW). A control end of the first switch 171 is electrically connected to the test pad 160 of the data line switch DSW, and a control end of the second switch 172 is electrically connected to the test pad 160 of the gate line switch GSW. The switch circuit is switched on only during the cell test method. In an alternative embodiment, during the cell test method, there is no switch circuit, wherein the above-mentioned shorting bars directly electrically connected to the above-mentioned gate lines and data lines.

In this embodiment, the test pads 160 for a cell test method using the shorting bars are corresponding to the data lines $D_{odd}$ and $D_{even}$, the gate lines $G_R$, $G_G$ and $G_B$, the data line switch DSW, the gate line switch GSW and common voltage $V_{com}$ respectively. When the common voltage $V_{com}$ is 5V (volt), a first waveform sequence of the above-mentioned shorting bars is shown in FIG. 12, if red pixels (R pixel) need to be turn on (shown in FIG. 11). When the first waveform sequence includes that the gate lines $G_R$ send a voltage of “turn-on” signal and the gate lines $G_G$ and $G_B$ send a voltage of “turn-off” signal at the first time period T1 and second time period T2, the R pixels defined by all of the gate lines $G_R$ and the data lines $D_{odd}$ and $D_{even}$ can be turn on, if the first and second data lines $D_{odd}$ and $D_{even}$ send a first voltage V1 and a second voltage V2 at the first time period T1 and second time period T2 respectively. (e.g., the first threshold voltage $V_{th1}$ is higher than the first voltage V1, the first voltage V1 is higher than the common voltage $V_{com}$, the common voltage $V_{com}$ is higher than the second voltage V2, and the second voltage V2 is higher than the second threshold voltage $V_{th2}$.) For example, when the first waveform sequence includes that the gate lines $G_R$ send a voltage of "turn-on" signal and the gate lines $G_G$ and $G_B$ send a voltage of "turn-off" signal at the first time period T1 and second time period T2 (e.g., 17V is the voltage of "turn-on" signal, and −8V is the voltage of "turn-off" signal), the R pixels defined by all of the gate lines $G_R$ and the data lines $D_{odd}$ and $D_{even}$ can be turn on, if the first and second data lines $D_{odd}$ and $D_{even}$ send 5.1V and 4.9V at the first time period T1 and second time period T2 respectively.

Figure 13:
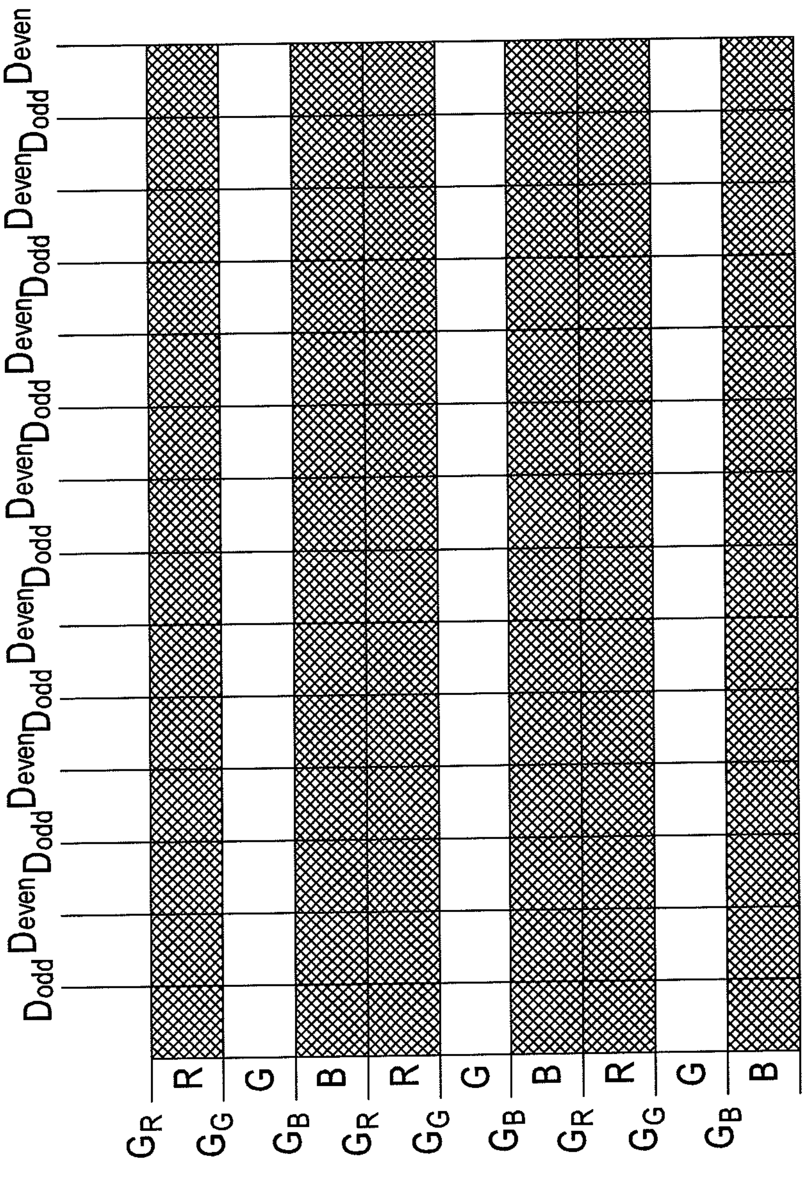
FIG. 13 is a schematic view showing that green pixels (G pixels) of a liquid crystal display panel according to the embodiment of the present disclosure are turn on at first and second time periods.
Figure 14:
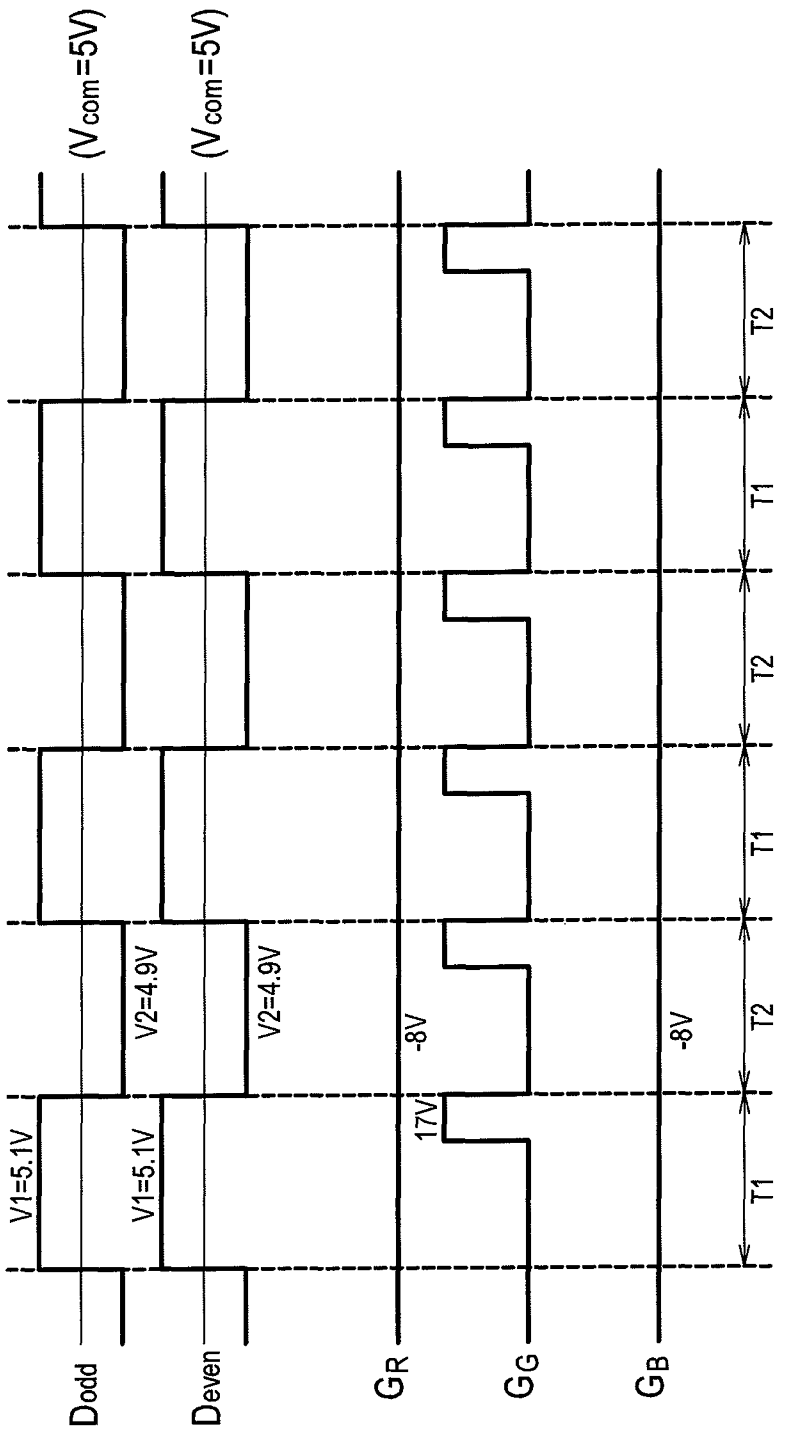

Similarly, when the common voltage $V_{com}$ is 5V (volt), a second waveform sequence of the above-mentioned shorting bars is shown in FIG. 14, if green pixels (G pixels) need to be turn on (shown in FIG. 13). For example, when the second waveform sequence includes that the gate lines $G_G$ send a voltage of "turn-on" signal and the gate lines $G_R$ and $G_B$ send a voltage of "turn-off" signal at the first time period T1 and second time period T2 (e.g., 17V is the voltage of "turn-on" signal, and −8V is the voltage of "turn-off" signal), the G pixels defined by all of the gate lines $G_G$ and the data lines $D_{odd}$ and $D_{even}$ can be turn on, if the first and second data lines $D_{odd}$ and $D_{even}$ send 5.1V and 4.9V at the first time period T1 and second time period T2 respectively.

Figure 15:
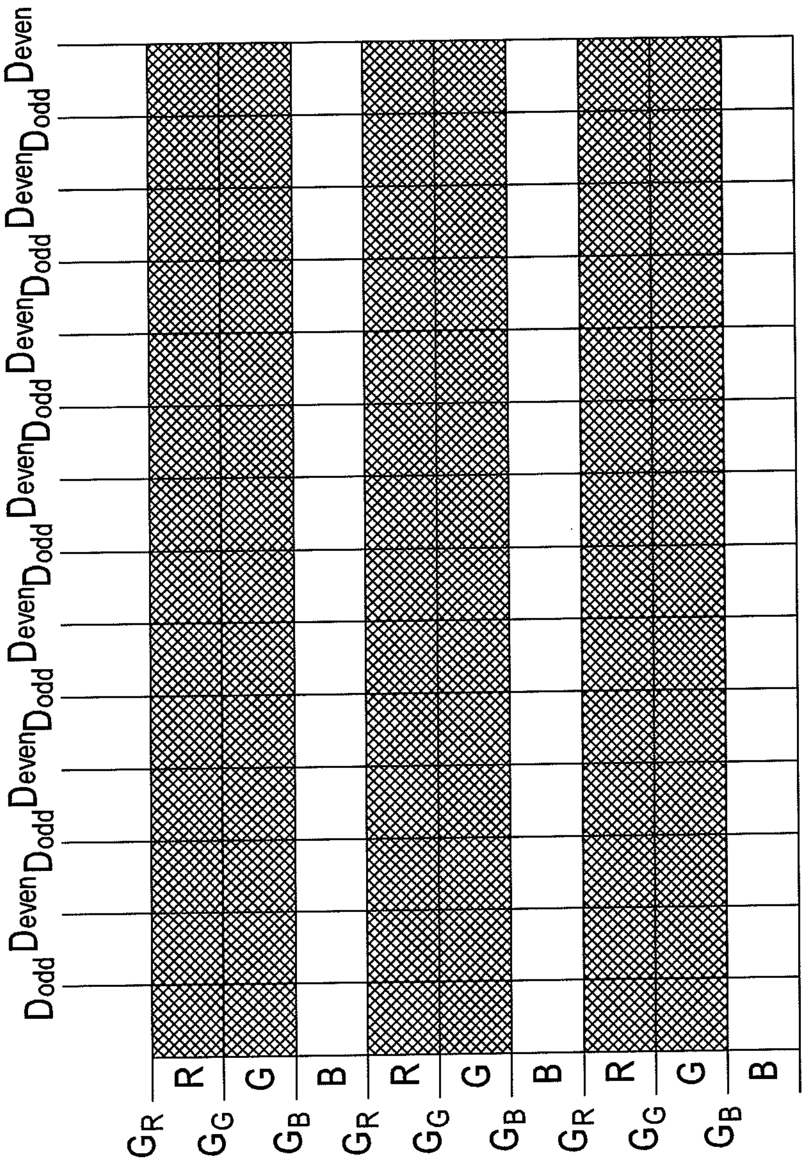
FIG. 15 is a schematic view showing that blue pixels (B pixels) of a liquid crystal display panel according to the embodiment of the present disclosure are turn on at first and second time periods.
Figure 16:
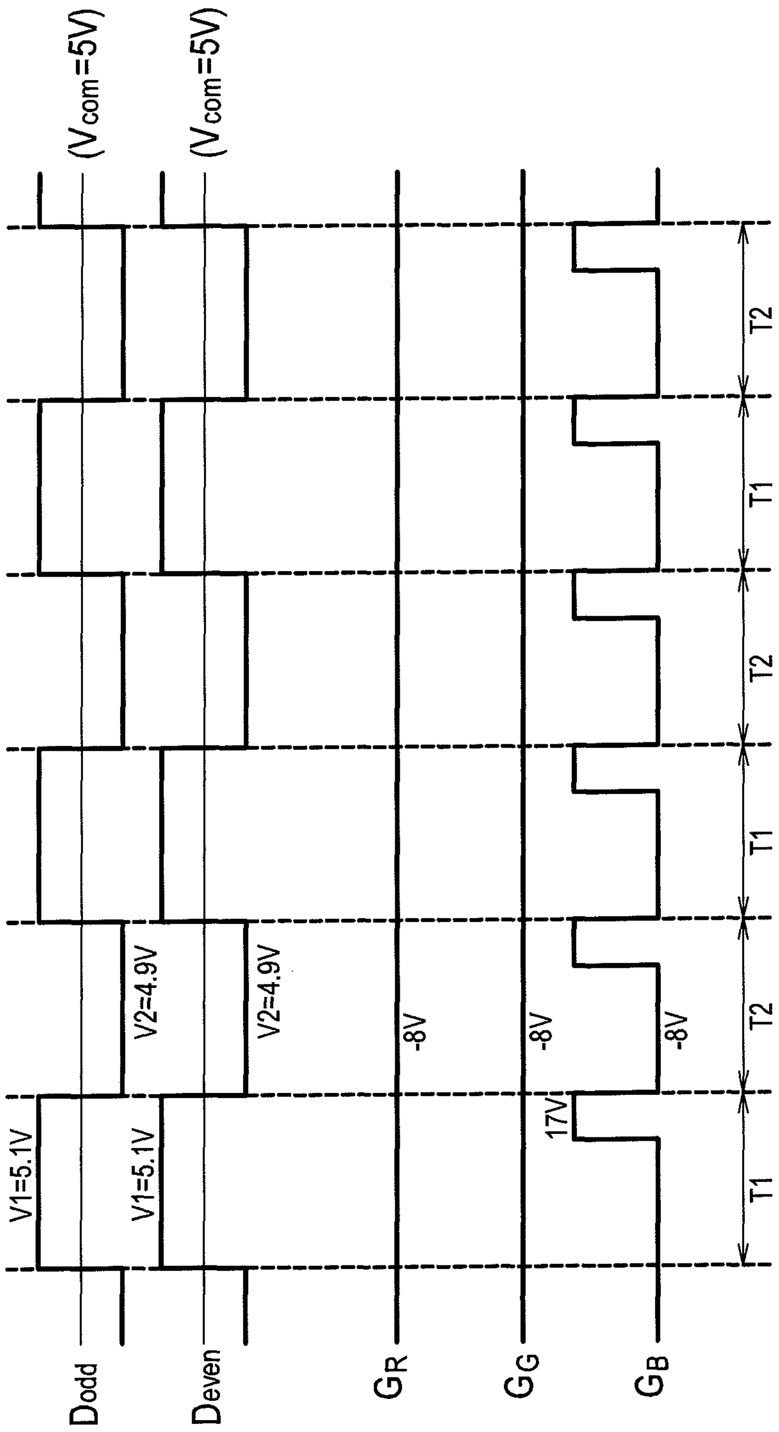

Similarly, when the common voltage $V_{com}$ is 5V (volt), a third waveform sequence of the shorting bars is shown in FIG. 16, if blue pixels (B pixels) need to be turn on (shown in FIG. 15). For example, when the third waveform sequence includes that the gate lines $G_B$ send a voltage of "turn-on" signal and the gate lines $G_R$ and $G_G$ send a voltage of "turn-off" signal at the first time period T1 and second time period T2 (e.g., 17V is the voltage of "turn-on" signal, and −8V is the voltage of "turn-off" signal), the B pixels defined by all of the gate lines $G_B$ and the data lines $D_{odd}$ and $D_{even}$ can be turn on, if the first and second data lines $D_{odd}$ and $D_{even}$ send 5.1V and 4.9V at the first time period T1 and second time period T2 respectively.

All gate lines are grouped into three sets of $G_R$, $G_G$ and $G_B$ in accordance with a color to be displayed by the gate lines, and three sets of $G_R$, $G_G$ and $G_B$ are physically connected to three gate line shorting bars respectively. All data lines are grouped into two sets of $D_{odd}$ and $D_{even}$ in accordance with odd and even, and two sets of $D_{odd}$ and $D_{even}$ are physically connected to two data line shorting bars respectively. During the cell test method, different signals are inputted to the three gate line shorting bars, and simultaneously same signals are inputted to the two data line shorting bars, thereby effectively inspecting defects of the R, G and B pixels.

Figure 11:
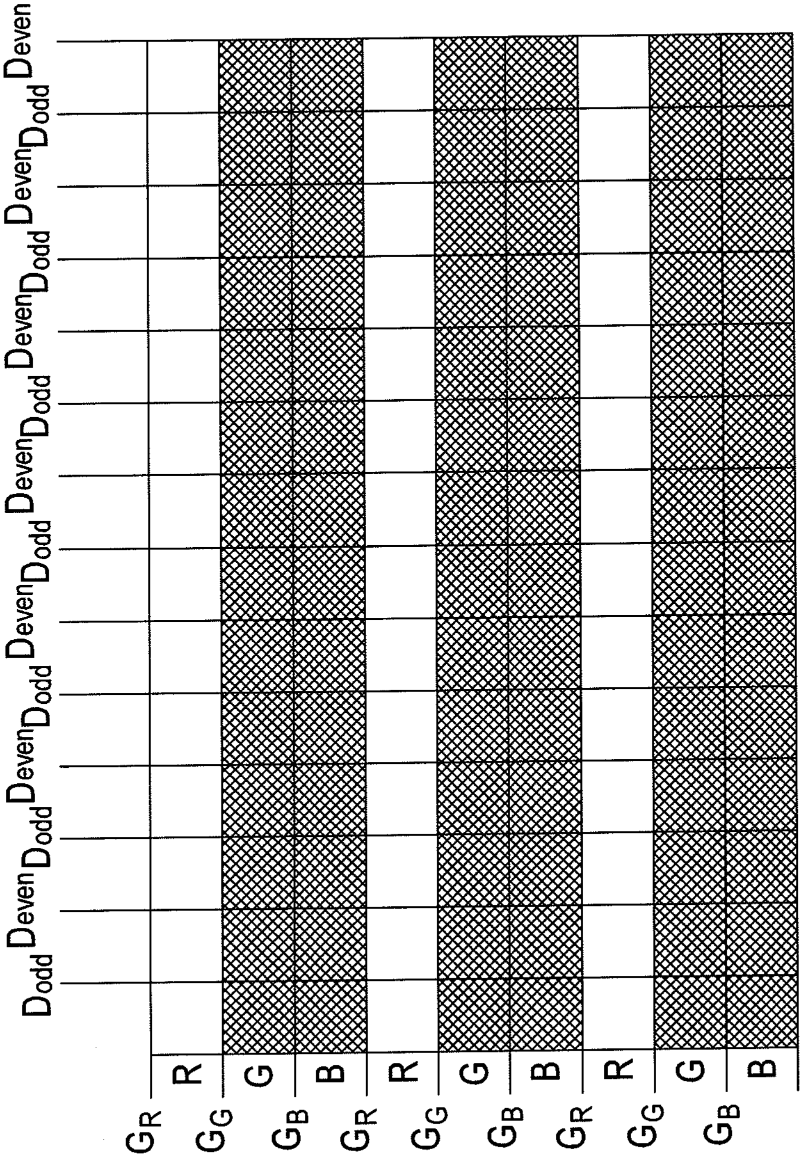
FIG. 11 is a schematic view showing that red pixels (R pixels) of a liquid crystal display panel according to the embodiment of the present disclosure are turn on at first and second time periods.
Figure 12:
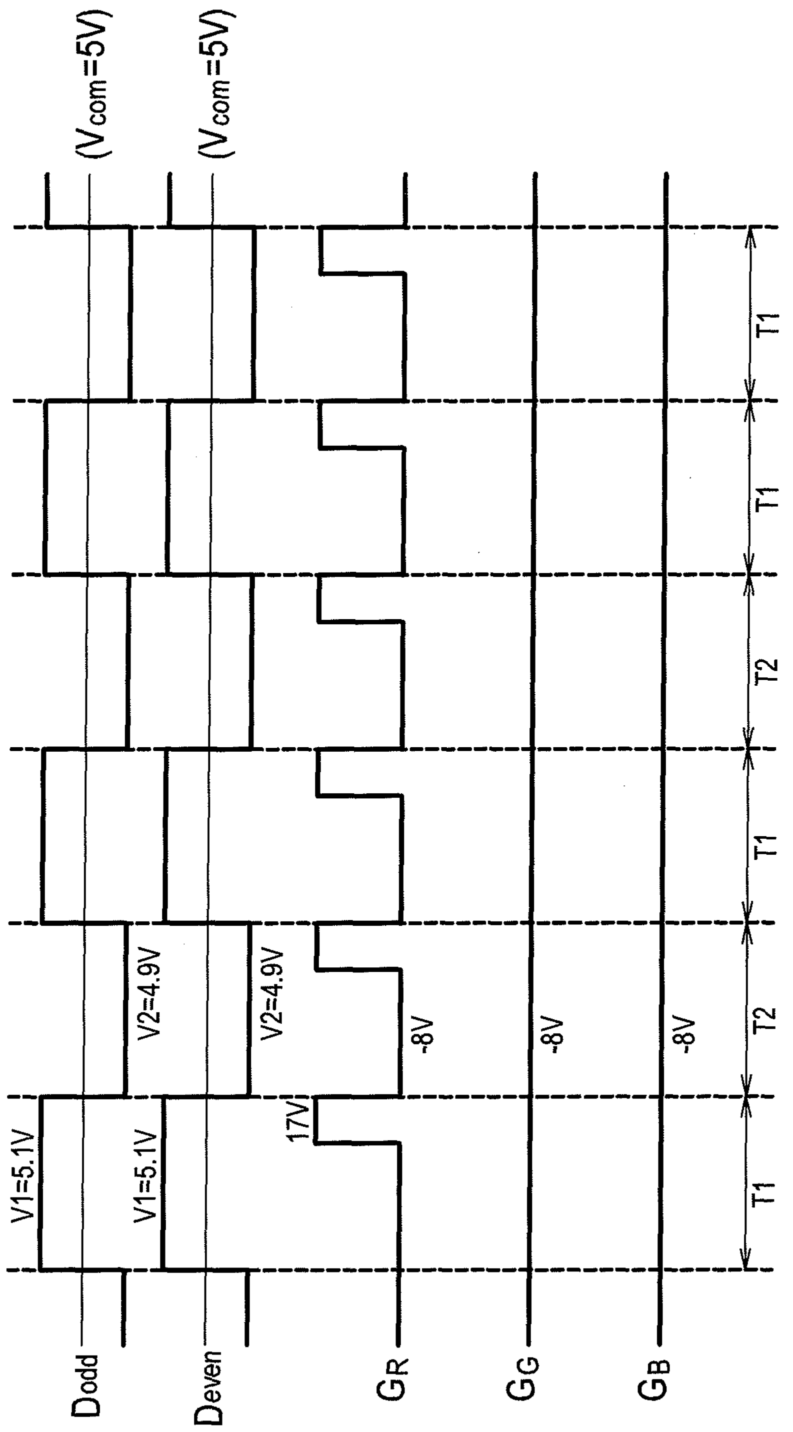
Figure 17:
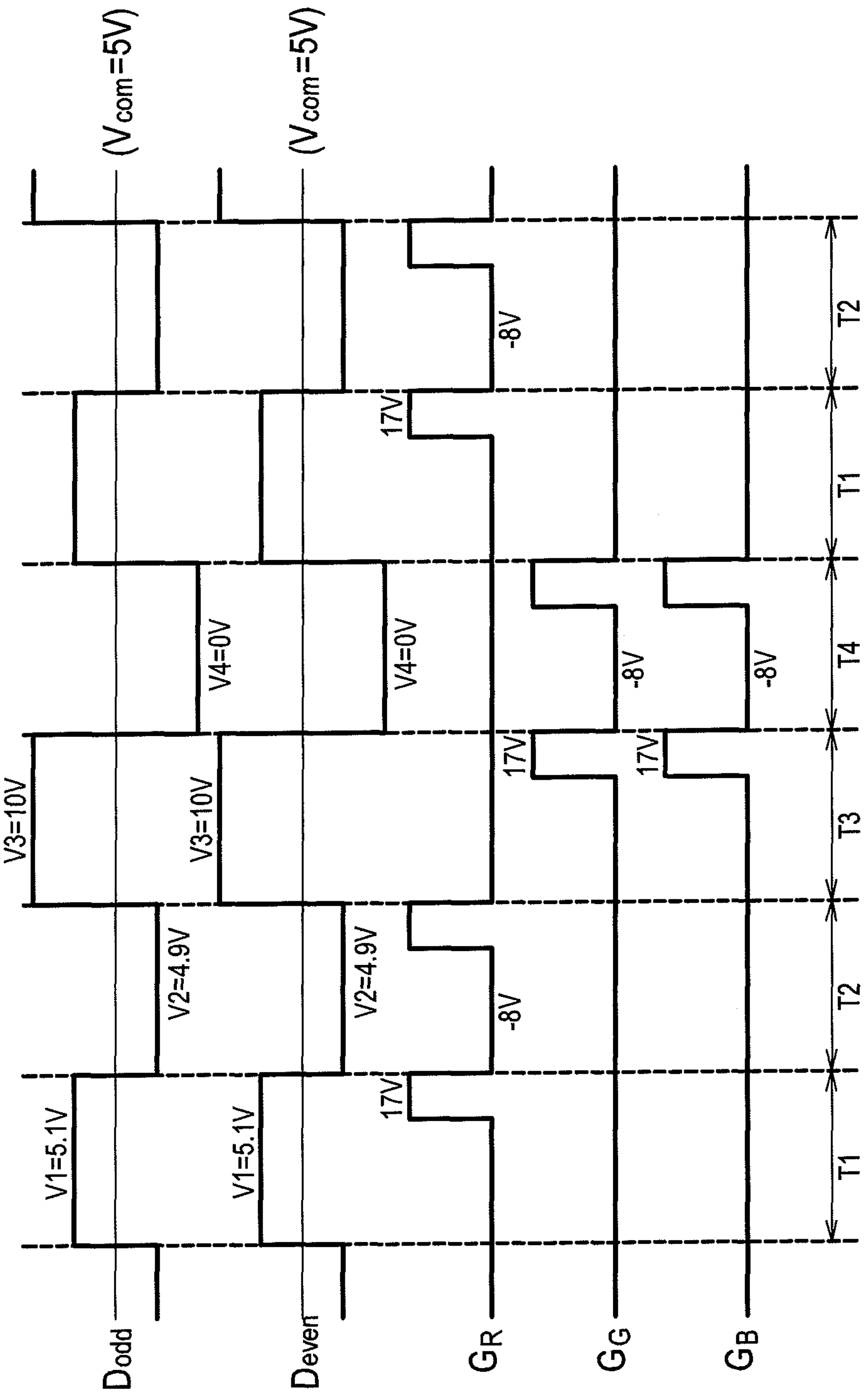
Figure 18:
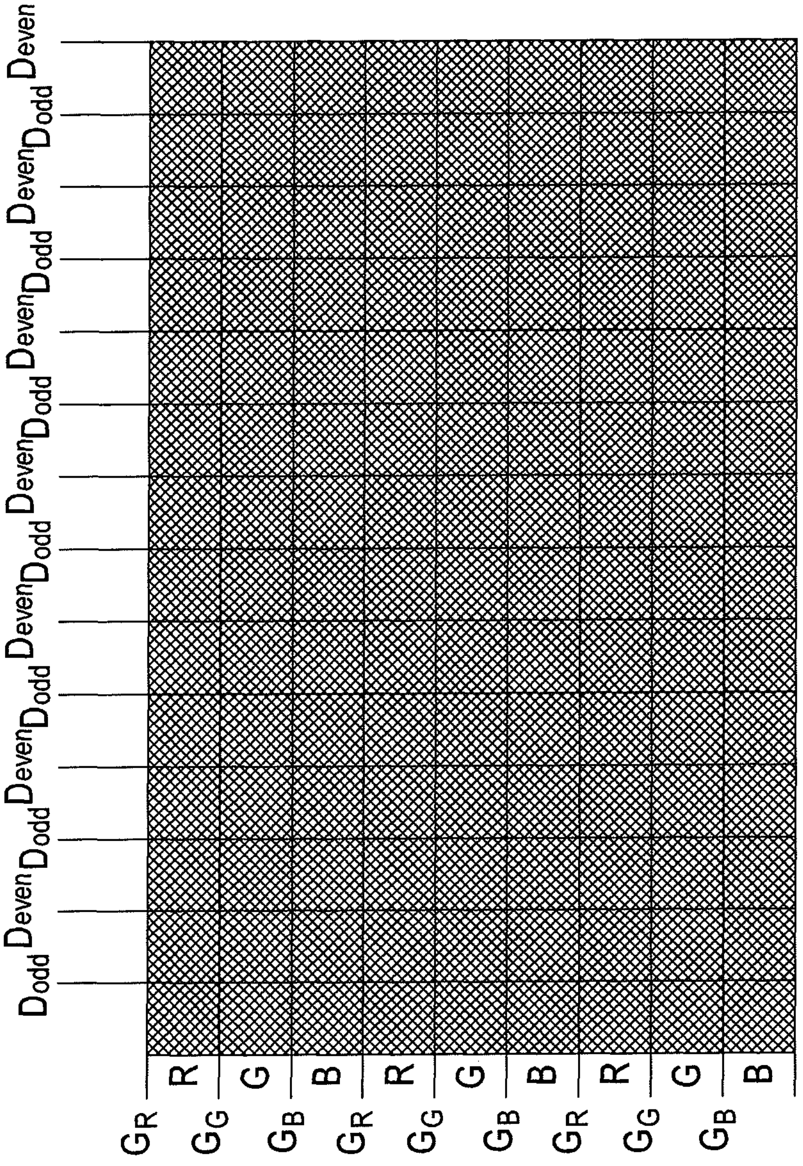
FIG. 18 is a schematic view showing that green pixels (G pixels) and blue pixels (B pixels) of a liquid crystal display panel according to another embodiment of the present disclosure are turn off at third and fourth time periods.

In another embodiment, when the common voltage $V_{com}$ is 5V (volt), a first waveform sequence of the above-mentioned shorting bars can be also shown in FIG. 17, if red pixels (R pixels) need to be turn on at the first time period T1 and second time period T2 (shown in FIG. 11). But, all pixels will be turn off at the third time period T3 and fourth time period T4 momently (shown in FIG. 18). When the first waveform sequence includes that the gate lines $G_R$ send a voltage of "turn-on" signal and the gate lines $G_G$ and $G_B$ send a voltage of "turn-off" signal at the first time period T1 and second time period T2 (e.g., 17V is the voltage of "turn-on" signal and −8V is the voltage of "turn-off" signal), the R pixels defined by all of the gate lines $G_R$ and the data lines $D_{odd}$ and $D_{even}$ can be turn on, if the first and second data lines $D_{odd}$ and $D_{even}$ send a first voltage V1 and a second voltage V2 at the first time period T1 and second time period T2 respectively. (e.g., the first threshold voltage $V_{th1}$ is higher than the first voltage V1, the first voltage V1 is higher than the common voltage $V_{com}$, the common voltage $V_{com}$ is higher than the second voltage V2, and the second voltage V2 is higher than the second threshold voltage $V_{th2}$.) When the first waveform sequence includes that the gate lines $G_R$ send a voltage of "turn-off" signal and the gate lines $G_G$ and $G_B$ send a voltage of "turn-on" signal at the third time period T3 and the fourth time period T4 (e.g., 17V is the voltage of "turn-on" signal, and −8V is the voltage of "turn-off" signal), the G pixels and B pixels defined by all of the gate lines $G_G$ and $G_B$ and the data lines $D_{odd}$ and $D_{even}$ can be turn off, if the first and second data lines $D_{odd}$ and $D_{even}$ send a third voltage V3 and a fourth voltage V4 at the third time period T3 and fourth time period T4 respectively. (e.g., the third voltage V3 is higher than the first threshold voltage $V_{th1}$, the first threshold voltage $V_{th1}$ is higher than the common voltage $V_{com}$, the common voltage $V_{com}$ is higher than the second threshold voltage $V_{th2}$, and the second threshold voltage $V_{th2}$ is higher than the fourth voltage V4.) For example, when the common voltage $V_{com}$ is 5V (volt), and the first and second data lines $D_{odd}$ and $D_{even}$ send the first voltage V1 (5.1V) and the second voltage V2 (4.9V) at the first time period T1 and second time period T2 respectively, the R pixels can be turn on, whereby liquid crystals of the R pixels can be rotated. When the common voltage $V_{com}$ is 5V (volt), and the first and second data lines $D_{odd}$ and $D_{even}$ send the third voltage V3 (10V) and the fourth voltage V4 (0V) at the third time period T3 and fourth time period T4 respectively, the G pixels and B pixels can be turn off, whereby liquid crystals of the G pixels and B pixels can be also rotated. Thus, the liquid crystals of the R pixels, G pixels and B pixels can be rotated during the testing time periods T1~T4.

Figure 19:
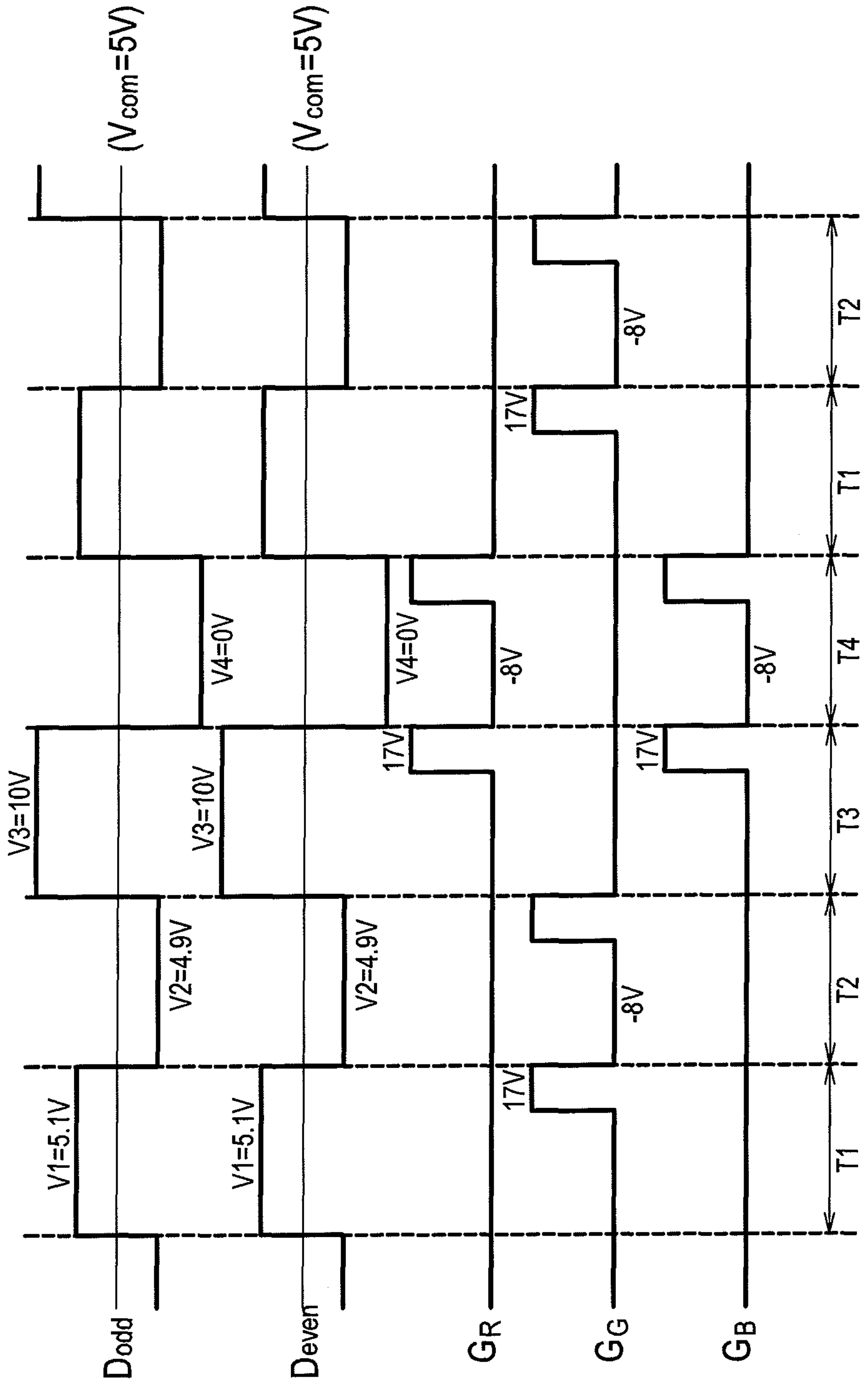

Similarly, when the common voltage $V_{com}$ is 5V (volt), a second waveform sequence of the above-mentioned shorting bars can be also shown in FIG. 19, if green pixels (G pixels) need to be turn on at the first time period T1 and second time period T2 (shown in FIG. 13). But, all pixels will be turn off at the third time period T3 and fourth time period T4 momently (shown in FIG. 18). For example, when the second waveform sequence includes that the gate lines $G_G$ send a voltage of "turn-on" signal and the gate lines $G_R$ and $G_B$ send a voltage of "turn-off" signal at the first time period T1 and second time period T2 (e.g., 17V is the voltage of "turn-on" signal, and −8V is the voltage of "turn-off" signal), the G pixels can be turn on, if the common voltage $V_{com}$ is 5V (volt), and the first and second data lines $D_{odd}$ and $D_{even}$ send the first voltage V1 (5.1V) and the second voltage V2 (4.9V) at the first time period T1 and second time period T2 respectively, whereby liquid crystals of the G pixels can be rotated. When the second waveform sequence includes that the gate lines $G_G$ send a voltage of "turn-off" signal and the gate lines $G_R$ and $G_B$ send a voltage of "turn-on" signal at the first time period T1 and second time period T2 (e.g., 17V is the voltage of "turn-on" signal, and −8V is the voltage of "turn-off" signal), the common voltage $V_{com}$ is 5V (volt), and the first and second data lines $D_{odd}$ and $D_{even}$ send the third voltage V3 (10V) and the fourth voltage V4 (0V) at the third time period T3 and fourth time period T4 respectively, the R pixels and B pixels can be turn off, whereby liquid crystals of the R pixels and B pixels can be also rotated. Thus, the liquid crystals of the R pixels, G pixels and B pixels can be rotated during the testing time periods T1~T4.

Figure 20:
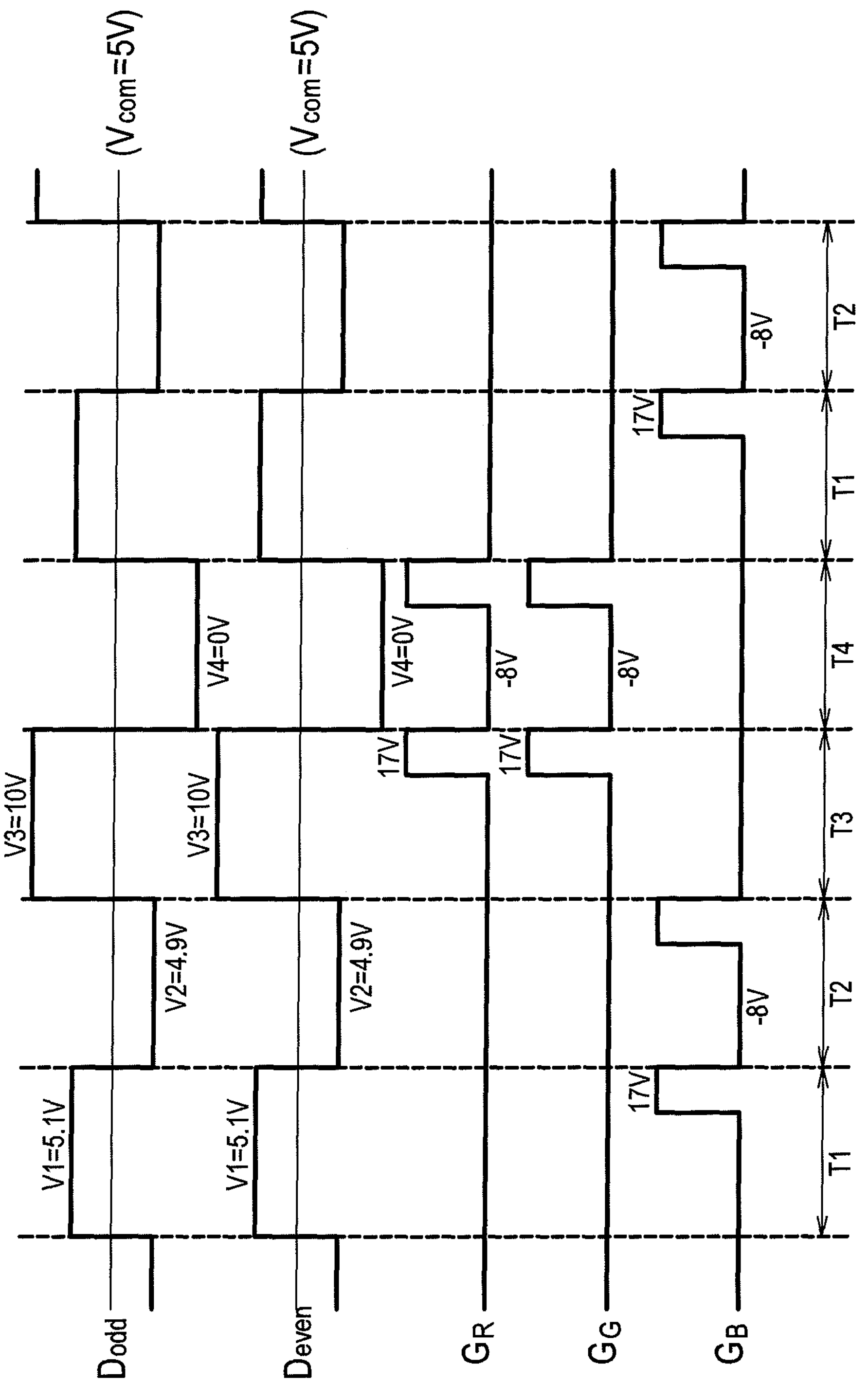

Similarly, when the common voltage $V_{com}$, is 5V (volt), a third waveform sequence of the shorting bars can be also shown in FIG. 20, if blue pixels (B pixels) need to be turn on at the first time period T1 and second time period T2 (shown in FIG. 15). But, all pixels will be turn off at the third time period T3 and fourth time period T4 momently (shown in FIG. 18). For example, when the third waveform sequence includes that the gate lines $G_B$ send a voltage of "turn-on"

signal and the gate lines $G_R$ and $G_G$ send a voltage of "turn-off" signal at the first time period T1 and second time period T2 (e.g., 17V is the voltage of "turn-on" signal, and −8V is the voltage of "turn-off" signal), the B pixels can be turn on, if the common voltage $V_{com}$ is 5V (volt), and the first and second data lines $D_{odd}$ and $D_{even}$ send the first voltage V1 (5.1V) and the second voltage V2 (4.9V) at the first time period T1 and second time period T2 respectively, whereby liquid crystals of the B pixels can be rotated. When the third waveform sequence includes that the gate lines $G_G$ send a voltage of "turn-off" signal and the gate lines $G_R$ and $G_B$ send a voltage of "turn-on" signal at the first time period T1 and second time period T2 (e.g., 17V is the voltage of "turn-on" signal and −8V is the voltage of "turn-off" signal), the common voltage $V_{com}$ is 5V (volt), and the first and second data lines $D_{odd}$ and $D_{even}$ send the third voltage V3 (10V) and the fourth voltage V4 (0V) at the third time period T3 and fourth time period T4 respectively, the R pixels and G pixels can be turn off, whereby liquid crystals of the R pixels and G pixels can be also rotated. Thus, the liquid crystals of the R pixels, G pixels and B pixels can be rotated during the testing time periods T1~T4.

Figure 21:
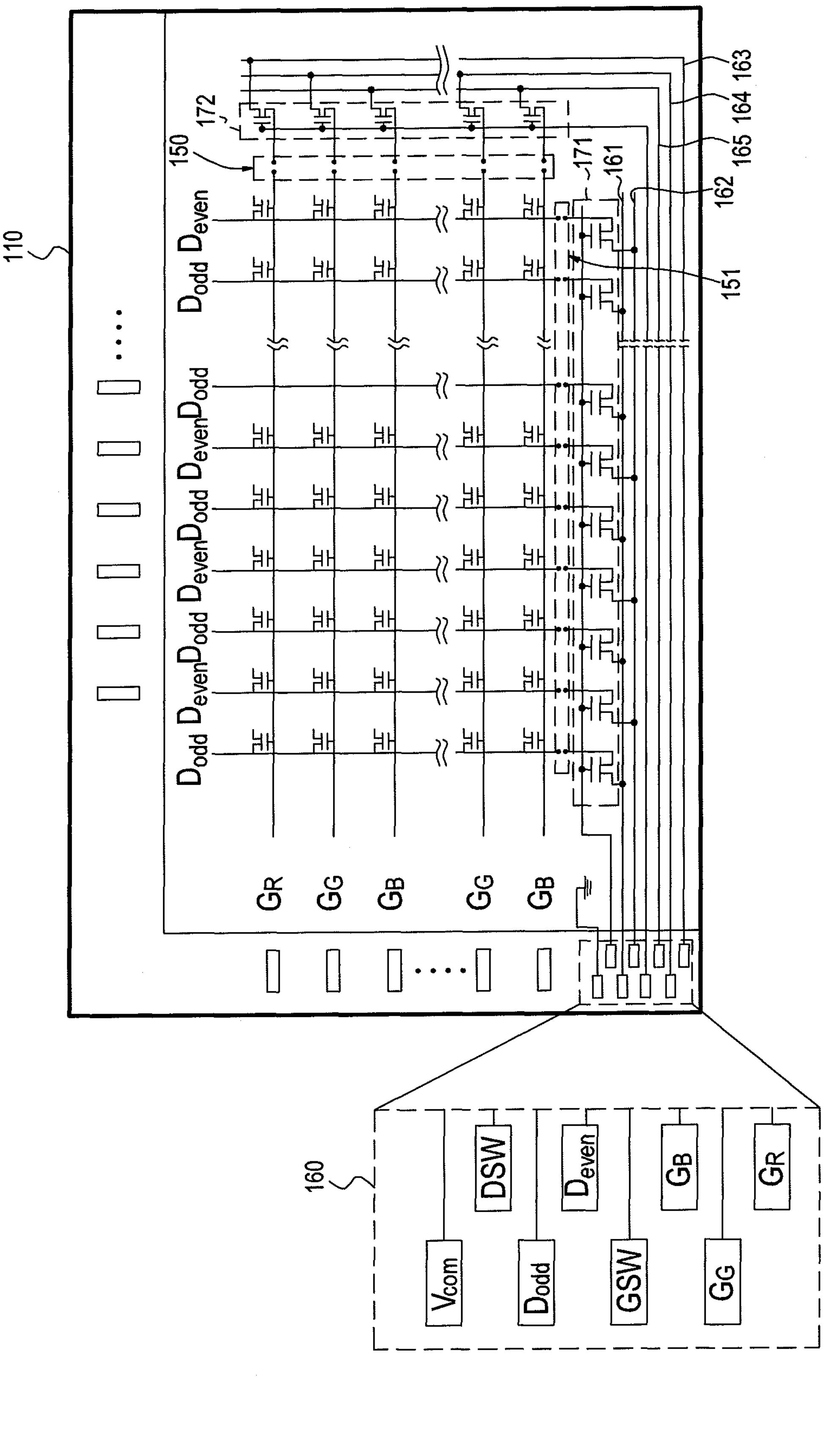
FIG. 21 is a schematic plan view of a liquid crystal display panel having a tri-gate type pixel structure according to the embodiment of the present disclosure, showing that after the cell test method, a cutting region is cut and a cutting region is cut by e.g., a laser process.

Referring to FIG. 21, after the cell test method, the first and second switches 171, 172 are used for electrically isolating the data line shorting bar 161 from odd data lines $D_{odd}$, electrically isolating the data line shorting bar 162 from odd data lines $D_{even}$, electrically isolating the gate line shorting bar 163 from red gate lines $G_R$, electrically isolating the gate line shorting bar 164 from green gate lines $G_G$, and electrically isolating the gate line shorting bar 165 from blue gate lines $G_B$. After electrically isolating actions of the first and second switches 171, 172, sequent processes can be proceeding.

Or, in an alternative embodiment, referring to FIG. 21 again, after the cell test method, a cutting region 150 located between gate lines $G_R$, $G_G$ and $G_B$, and gate line shorting bars 163, 164, 165 is cut, and a cutting region 151 located between data lines $D_{odd}$ and $D_{even}$, and data line shorting bars 161, 162 is cut by e.g., a laser process, if there is no the first and second switches. After the cutting region 150 is cut, the data line shorting bar 161 can be electrically isolated from odd data lines $D_{odd}$, the data line shorting bar 162 can be electrically isolated from odd data lines $D_{even}$. After the cutting region 151 is cut, the gate line shorting bar 163 can be electrically isolated from red gate lines $G_R$, the gate line shorting bar 164 can be electrically isolated from green gate lines $G_G$, and the gate line shorting bar 165 can be electrically isolated from blue gate lines $G_B$. After the cutting regions 150, 151 are cut, sequent processes can be proceeding.

The disclosure being thus described, it will be obvious that the same may be varied in many ways. Such variations are not to be regarded as a departure from the spirit and scope of the disclosure, and all such modifications as would be obvious to one skilled in the art are intended to be included within the scope of the following claims.

What is claimed is:

1. A cell test method for a liquid crystal display panel, the liquid crystal display panel including a plurality of first, second and third gate lines, a plurality of first and second data lines, a first gate line shorting bar, a second gate line shorting bar, a third gate line shorting bar, a first data line shorting bar and a second data line shorting bar, the first, second and third gate lines periodically disposed in order and electrically connected or electrically coupled to the first, second and third gate line shorting bars respectively, the first and second data lines periodically disposed in order and electrically connected or electrically coupled to the first and second data line shorting bars respectively, and the liquid crystal display panel having a common voltage, a first threshold voltage and a second threshold voltage, the cell test method comprising the following steps of:

providing a first waveform sequence to the first, second and third gate line shorting bars and the first and second data line shorting bars, wherein the first waveform sequence comprises the following steps of:

sending a voltage of "turn-on" signal to the first gate lines, and sending a voltage of "turn-off" signal to the second and third gate lines at first time period and second time period; and sending a first voltage and a second voltage to the first and second data lines at the first and second time period respectively, wherein the first threshold voltage is higher than the first voltage, the first voltage is higher than the common voltage, the common voltage is higher than the second voltage, and the second voltage is higher than the second threshold voltage, whereby pixels defined by all of the first gate lines and the first and second data lines are turn on.

2. The cell test method according to claim 1, further comprising the following steps of:

providing a second waveform sequence to the first, second and third gate line shorting bars and the first and second data line shorting bars, wherein the second waveform sequence comprises the following steps of:

sending a voltage of "turn-on" signal to the second gate lines, and sending a voltage of "turn-off" signal to the first and third gate lines at the first time period and the second time period; and sending the first voltage and the second voltage to the first and second data lines at the first and second time periods respectively, wherein the first threshold voltage is higher than the first voltage, the first voltage is higher than the common voltage, the common voltage is higher than the second voltage, and the second voltage is higher than the second threshold voltage, whereby pixels defined by all of the second gate lines and the first and second data lines are turn on.

3. The cell test method according to claim 2, further comprising the following steps of:

providing a third waveform sequence to the first, second and third gate line shorting bars and the first and second data line shorting bars, wherein the third waveform sequence comprises the following steps of:

sending a voltage of "turn-on" signal to the third gate lines, and sending a voltage of "turn-off" signal to the first and second gate lines at the first time period and the second time period; and sending the first voltage and the second voltage to the first and second data lines at the first and second time periods respectively, wherein the first threshold voltage is higher than the first voltage, the first voltage is higher than the common voltage, the common voltage is higher than the second voltage, and the second voltage is higher than the second threshold voltage, whereby pixels defined by all of the third gate lines and the first and second data lines are turn on.

4. The cell test method according to claim 3, wherein the first, second and third gate lines are red, green and blue gate lines respectively, and first and second data lines are odd and even data lines respectively.

5. The cell test method according to claim 4, wherein the voltage of "turn-on" signal is 17V, the voltage of "turn-off" signal is −8V, the common voltage is 5V, the first voltage is 5.1V, and the second voltage is 4.9V.

6. The cell test method according to claim 3, wherein the first waveform sequence further comprises the following steps of:

sending a voltage of "turn-on" signal to the first gate lines, and sending a voltage of "turn-off" signal to the second and third gate lines at third time period and fourth time period; and sending a third voltage and a fourth voltage to the first and second data lines at the third time period and fourth time period respectively, wherein the third voltage is higher than the first threshold voltage, the first threshold voltage is higher than the common voltage, the common voltage is higher than the second threshold voltage, and the second threshold voltage is higher than the fourth voltage, whereby pixels defined by all of the second and third gate lines and the first and second data lines can be turn off.

7. The cell test method according to claim 6, wherein the second waveform sequence further comprises the following steps of:

sending a voltage of "turn-on" signal to the second gate lines, and sending a voltage of "turn-off" signal to the first and third gate lines at the third time period and the fourth time period; and sending a third voltage and a fourth voltage to the first and second data lines at the third time period and fourth time period respectively, wherein the third voltage is higher than the first threshold voltage, the first threshold voltage is higher than the common voltage, the common voltage is higher than the second threshold voltage, and the second threshold voltage is higher than the fourth voltage, whereby pixels defined by all of the first and third gate lines and the first and second data lines can be turn off.

8. The cell test method according to claim 7, wherein the third waveform sequence further comprises the following steps of:

sending a voltage of "turn-off" signal to the third gate lines, and sending a voltage of "turn-on" signal to the first and second gate lines at the third time period and the fourth time period; and sending a third voltage and a fourth voltage to the first and second data lines at the third time period and fourth time period respectively, wherein the third voltage is higher than the first threshold voltage, the first threshold voltage is higher than the common voltage, the common voltage is higher than the second threshold voltage, and the second threshold voltage is higher than the fourth voltage, whereby pixels defined by all of the first and second gate lines and the first and second data lines can be turn off.

9. The cell test method according to claim 8, wherein the first, second and third gate lines are red, green and blue gate lines respectively, and first and second data lines are odd and even data lines respectively.

10. The cell test method according to claim 9, wherein the voltage of "turn-on" signal is 17V, the voltage of "turn-off" signal is −8V, the common voltage is 5V, the first voltage is 5.1V, the second voltage is 4.9V, the third voltage is 10V, and the second voltage is 0V.

11. The cell test method according to claim 1, wherein the liquid crystal display panel further includes a plurality of test pads disposed a non-display region of the liquid crystal display panel and electrically connected to the first, second and third gate line shorting bars and the first and second data line shorting bars respectively, whereby when the liquid crystal display panel is executed by the cell test method, a test signal is inputted to the test pads, and transmitted from the first, second and third gate line shorting bars and the first and second data line shorting bars to the first, second and third gate line and the first and second data line.

12. The cell test method according to claim 1, wherein the liquid crystal display panel further includes a switch circuit, the switch circuit includes:

a first switch adapted to selectively electrically coupled the first, second and third gate lines to the first, second and third gate line shorting bars respectively or electrically isolating the first, second and third gate lines from the first, second and third gate line shorting bars respectively; and a second switch adapted to selectively electrically coupled to the first and second data lines to the first and second data line shorting bars respectively, or electrically isolating the first and second data lines from the first and second data line shorting bars respectively.

* * * * *